(12) United States Patent
Masuoka et al.

(10) Patent No.: US 8,218,387 B2
(45) Date of Patent: Jul. 10, 2012

(54) SEMICONDUCTOR STORAGE DEVICE

(75) Inventors: Fujio Masuoka, Tokyo (JP); Shintaro Arai, Tokyo (JP)

(73) Assignee: Unisantis Electronics Singapore PTE Ltd., Singapore (SG)

( * ) Notice: Subject to any disclaimer, the term of this patent is extended or adjusted under 35 U.S.C. 154(b) by 0 days.

(21) Appl. No.: 13/208,826

(22) Filed: Aug. 12, 2011

(65) Prior Publication Data

US 2011/0298029 A1    Dec. 8, 2011

Related U.S. Application Data

(60) Division of application No. 12/702,719, filed on Feb. 9, 2010, now Pat. No. 8,023,352, which is a continuation of application No. PCT/JP2009/051464, filed on Jan. 29, 2009.

(60) Provisional application No. 61/207,599, filed on Feb. 13, 2009.

(30) Foreign Application Priority Data

Jan. 29, 2008    (WO) .................. PCT/JP2008/051299

(51) Int. Cl.
*G11C 7/02* (2006.01)

(52) U.S. Cl. ............ 365/210.1; 365/210.13; 365/210.15

(58) Field of Classification Search ............... 365/210.1, 365/210.13, 210.15

See application file for complete search history.

(56) References Cited

U.S. PATENT DOCUMENTS

| | | | |
|---|---|---|---|
| 5,610,868 A | 3/1997 | Inaba et al. | |
| 6,313,497 B1 | 11/2001 | Iwasa | |
| 6,440,801 B1 * | 8/2002 | Furukawa et al. | 438/272 |
| 6,928,012 B2 | 8/2005 | Camacho et al. | |
| 2002/0114191 A1 | 8/2002 | Iwata et al. | |
| 2003/0206472 A1 | 11/2003 | Hidaka et al. | |

FOREIGN PATENT DOCUMENTS

| | | |
|---|---|---|
| JP | 07-099311 A | 4/1995 |
| JP | 07-161829 A | 6/1995 |
| JP | 07-244414 A | 9/1995 |
| JP | 08-241594 A | 9/1996 |
| JP | 2000-236076 A | 8/2000 |

OTHER PUBLICATIONS

International Search Report for International Application No. PCT/JP2008/051299, dated May 13, 2008, 1 page. International Search Report for International Application No. PCT/JP2009/051464, dated Feb. 24, 2009, 1 page.
International Preliminary Report on Patentability for International Application No. PCT/JP2008/051299, dated Aug. 31, 2010, 4 pages.
International Preliminary Report on Patentability for International Application No. PCT/JP2009/051464, dated Aug. 31, 2010, 4 pages.

* cited by examiner

*Primary Examiner* — Vu Le
*Assistant Examiner* — Han Yang
(74) *Attorney, Agent, or Firm* — Brinks Hofer Gilson & Lione

(57) ABSTRACT

In a $4F^2$ memory cell designed using an SGT as a vertical transistor, a bit line has a high resistance because it is comprised of a diffusion layer underneath a pillar-shaped silicon layer, which causes a problem of slowdown in memory operation speed. The present invention provides a semiconductor storage device comprising an SGT-based $4F^2$ memory cell, wherein a bit line-backing cell having the same structure as that of a memory cell is inserted into a memory cell array to allow a first bit line composed of a diffusion layer to be backed with a low-resistance second bit line through the bit line backing cell, so as to provide a substantially low-resistance bit line, while suppressing an increase in area of the memory cell array.

6 Claims, 46 Drawing Sheets

(a)

(b)

(c)

(a)

(b)

(c)

(a)

(b)

(c)

(a)

(b)

(c)

(a)

(b)

(c)

(b)                     (c)

(a)

(b) (c)

(b)  (c)

(a)

(b)

(c)

(a)

(b)    (c)

(a)

(b)

(c)

(a)

(b)         (c)

(a)

(b)

(c)

(a)

(b)

(c)

(a)

(b)

(c)

(a)

(b)          (c)

(a)

(b)

(c)

(a)

(b)          (c)

(a)

(b)     (c)

(a)

(b)

(c)

(a)

(b)

(c)

(a)

(b)        (c)

(a)

(b)

(c)

(a)

(b)

(c)

(a)

(b)

(c)

(a)

(b)

(a)

(b)

SEMICONDUCTOR STORAGE DEVICE

CROSS-REFERENCE TO RELATED APPLICATIONS

This Application is a divisional of U.S. application Ser. No. 12/702,719, filed Feb. 9, 2010, the disclosure of which is herein incorporated by reference. U.S. application Ser. No. 12/702,719 claims the benefit of the filing date of Provisional U.S. Patent Application Ser. No. 61/207,599 filed on Feb. 13, 2009 pursuant to 35 U.S.C. §119(e). U.S. application Ser. No. 12/702,719 is also a continuation application of PCT/JP2009/051464 filed on Jan. 29, 2009 which claims priority under 35 U.S.C. §365(a) to PCT/JP2008/051299 filed on Jan. 29, 2008. The entire contents of Provisional U.S. Patent Application Ser. No. 61/207,599, PCT/JP2009/051464 and PCT/JP2008/051299 are hereby incorporated by reference.

BACKGROUND OF THE INVENTION

1. Technical Field

The present invention relates to a semiconductor storage device and a production method therefor.

2. Background Art

With a view to achieving higher integration and higher performance of an LSI, an SGT (Surrounding Gate Transistor) has been proposed which is a vertical transistor comprising a pillar-shaped semiconductor layer formed on a surface of a semiconductor substrate, and a gate formed to surround a sidewall of the pillar-shaped semiconductor layer (see Patent Document 1: JP 2-188966A). In the SGT, a source, a gate and a drain are arranged in a vertical direction, so that an occupancy area can be significantly reduced as compared with a conventional planar transistor.

In cases where a DRAM is designed using an SGT, a memory cell array can be configured as a cross-point type, so that a cell size of $4F^2$ can be achieved, in theory. Thus, it is possible to drastically reduce a cell size, as compared with a conventional planar transistor-based DRAM having a cell size of $6F^2$ or $8F^2$. Therefore, an SGT-based DRAM (hereinafter referred to as "SGT-DRAM") has great potential as a DRAM requiring higher integration as a top priority, and an embedded memory for a CPU requiring an increase in capacity of a cache memory, etc. An example of a conventional SGT-DRAM is disclosed in the Patent Document 1 and the following Patent Document 2. The conventional example will be described below.

An SGT-DRAM disclosed in the Patent Document 1 will be described based on FIGS. 60(a) and 60(b) which are a top plan view and a bird's-eye view thereof, respectively. Referring to the top plan view of FIG. 60(a), a pillar-shaped silicon layer 703 is formed on an intersection of a word line 701 and a bit line 702, and a selection transistor Qm7 is formed based on the pillar-shaped silicon layer. Further, a capacitance element Cm7 is formed on a top of the selection transistor. Thus, a cross-point memory cell, i.e., a memory cell located at the intersection of the bit line and the word line, is constructed. Referring to the bird's-eye view of FIG. 60(b), the bit line is comprised of an $N^+$ diffusion layer 702, and the word line 701 is comprised of polysilicon. The pillar-shaped silicon layer 703 is fabricated by forming a contact hole to extend from a top to a bottom of the word line and then forming a gate dielectric film and a silicon film within the contact hole through epitaxial growth to make up the selection transistor Qm7. The capacitance element Cm7 is formed on the top of the selection transistor Qm7 to have the same structure as that of a capacitance element in a conventional stacked DRAM. In this SGT-DRAM, although a memory cell area is as small as $4F^2$, there is the following problem. The bit line comprised of the $N^+$ diffusion layer 702 has a significantly high resistance, as compared with a bit line comprised of a metal film, such as a tungsten film, which is commonly used in conventional DRAMs having a cell size of $6F^2$ and $8F^2$. Particularly, as a prerequisite to achieving a cell size of $4F^2$ in this SGT-DRAM, it is necessary to form the bit line in a minimum fabrication size (F). Thus, along with progress of miniaturization, a DRAM operation speed becomes slower due to an increase in resistance of the bit line, to cause difficulty in achieving a DRAM operation speed required in the future.

The Patent Document 2 discloses an SGT-DRAM designed while taking into account the above problem. The SGT-DRAM disclosed in the Patent Document 2 will be described based on FIGS. 61(a) and 61(b) which are a top plan view and a sectional view thereof, respectively. Referring to the top plan view and the sectional view of FIGS. 61(a) and 61(b), in a DRAM cell, a capacitance contact 805 is laterally offset from a top of a pillar-shaped silicon layer 803. Thus, as compared with the DRAM cell in the Patent Document 1, a cell size is increased to about $8F^2$. However, a bit line 802 can be comprised of tungsten polyside (a laminated film of tungsten silicide and polysilicon) to have a lower resistance than that of the $N^+$ diffusion layer, so that it is possible to suppress the problem of a reduction in DRAM operation speed due to an increase in resistance of a bit line in the Patent Document 1.

However, this SGT-DRAM has the following problem. The pillar-shaped silicon layer 803 is fabricated by forming a contact hole to extend from a top to a bottom of a gate electrode and then growing silicon from the tungsten polyside bit line within the contact hole, in the same manner as that in the Patent Document 1. The silicon is transformed into polysilicon through a heat treatment for forming a transistor, so that a large number of defects, such as grain boundaries, occur in the pillar-shaped silicon layer. DRAM production yield is extremely sensitive to junction leak caused by defects in a transistor. Thus, it is difficult to ensure sufficient production yield by the above production method. As above, although the SGT-DRAM disclosed in the Patent Document 2 is capable of lowering a resistance of a bit line, it would be hardly practicable due to difficulty in ensuring sufficient production yield.

As measures against an increase in resistance of a bit line as described above, it is contemplated to reduce the number of memory cells to be connected to one bit line, so as to shorten a length of the bit line. In existing planar transistor-based DRAMs, a bit line is comprised of a low-resistance metal film, and about 256 or 512 memory cells are generally connected to one bit line. For example, if the number of bit lines to be connected to one bit line can be reduced to about 32 or 64, it is possible to suppress the reduction in operation speed even if a high-resistance bit line is used. However, if the number of bit lines to be connected to one bit line is reduced to downsize a DRAM cell array, an extra area due to an increase in the number of peripheral circuits is increased to cause a significant increase in chip area.

Patent Document 1: JP 7-99311A
Patent Document 2: JP 7-244414A

In view of the above problems, as a prerequisite to practical realization of an SGT-DRAM, it is essential to achieve a memory cell capable of reducing a memory cell size to about $4F^2$, and lowering a resistance of a bit line, while ensuring sufficient production yield.

As means for lowering a resistance of a bit line, there are a first technique of using a low-resistance material for a bit line as in the Patent Document 2, and a second technique of backing a bit line with a low-resistance interconnection layer to provide a substantially low-resistance bit line. In the present invention, the second technique of backing a bit line with a low-resistance interconnection layer is employed as the means for lowering a resistance of a bit line.

The present invention provides a memory cell structure designed such that a high-resistance bit line comprised of a diffusion layer is backed with a relatively low-resistance interconnection line within a memory cell array to provide a substantially low-resistance bit line, while minimizing an increase in extra area.

SUMMARY OF THE INVENTION

According to a first aspect of the present invention, there is provided a semiconductor storage device designed using a vertical transistor which has a structure where a drain, a gate and a source are arranged in a vertical direction with respect to a pillar-shaped silicon layer, and a gate electrode is formed to surround the pillar-shaped silicon layer. The semiconductor storage device comprises a memory cell array formed with a plurality of first bit lines each comprised of a first layer and connected to a sense amplifier, and a plurality of second bit lines each comprised of a different layer from the first layer and connected to the sense amplifier. Each of the second bit lines has a lower resistance than that of the first bit line. In the memory cell array, a plurality of the vertical transistors are formed on each of the first bit lines, in a row, in such a manner as to allow the gate electrodes of the vertical transistors to serve as respective ones of a plurality of word lines each wired in a direction perpendicular to a corresponding one of the first bit lines. Further, each of the vertical transistors includes a first transistor for selecting an associated one of the memory cells, and a second transistor for connecting corresponding ones of the first bit lines and the second bit lines. The second transistor is adapted to be kept in its ON state during an operation of the storage device, whereby each of the first bit lines is backed with the corresponding one of the second bit lines to allow the first and second bit lines to form a substantially low-resistance bit line.

According to a second aspect of the present invention, in the semiconductor storage device according to the first aspect, each of the first transistor and the second transistor has the same structure and the same layout configuration.

According to a third aspect of the present invention, in the semiconductor storage device according to the first or second aspect, the memory cell array is configured as a cross-point cell array where a word line and a bit line orthogonally intersect each other, and a memory cell is formed at the intersection of the word line and the bit line.

According to a fourth aspect of the present invention, in the semiconductor storage device according to any one of the first to third aspects, each of the memory cells is a dynamic memory comprising a single transistor consisting of the first transistor and a single capacitance element.

According to a fifth aspect of the present invention, the semiconductor storage device according to any one of the first to fourth aspects further comprises a first contact formed on the first transistor and connected to a capacitance element formed on a top of the first contact, and a second contact formed on the second transistor, wherein: each of the second bit lines is formed in a lower-level layer than that of the capacitance element formed on the top of the first contact; the second contact is connected to a corresponding one of the second bit lines; and the first contact is formed between adjacent ones of the second bit lines in such a manner as to be kept from contacting the adjacent second bit lines.

According to a sixth aspect of the present invention, the semiconductor storage device according to the fifth aspect further comprises a substantially non-usable dummy capacitance element formed on the second transistor to maintain regularity of the capacitance elements in the memory cell array.

According to a seventh aspect of the present invention, the semiconductor storage device according to any one of the first to fourth aspects comprises a first contact formed on the first transistor and connected to a first capacitance element formed on a top of the first contact, and a second contact formed on the second transistor, wherein each of the second bit lines is comprised of an interconnection line formed in a higher-level layer than that of a second capacitance element formed on a top of the second contact, and the second contact is led out of a top of the second capacitance element through a contact hole formed in an electrode of the second capacitance element, and connected to a corresponding one of the second bit lines.

According to an eighth aspect of the present invention, there is provided a semiconductor storage device which has the same structure as that of the semiconductor storage device according to the first aspect, except that corresponding ones of the first and second bit lines are connected to each other through a pillar-shaped semiconductor layer entirely comprised of a diffusion layer without forming the gate electrode therearound, instead of the second transistor.

According to a ninth aspect of the present invention, there is provided a semiconductor storage device which has the same structure as that of the semiconductor storage device according to the first aspect, except that corresponding ones of the first and second bit lines are directly connected to each other through a contact, instead of the second transistor.

According to a tenth aspect of the present invention, in the semiconductor storage device according to the first aspect, the first layer is formed on a bulk silicon substrate.

DETAILED DESCRIPTION OF THE PREFERRED EMBODIMENTS

In the present invention, as means for solving the aforementioned conventional problems, a backing cell is inserted within a memory cell array with respect to each row consisting of a plurality of (e.g., 16 or 32) regular memory cells connected onto one bit line, so that a high-resistance bit line comprised of an $N^+$ diffusion layer is backed with a relatively low-resistance bit line through the backing cell to provide a substantially low-resistance bit line. However, in the memory cell array using such a backing cell, if a structure or a layout configuration of the backing cell is different from that of the regular memory cell, characteristics of a part of the regular memory cells adjacent to the backing cells are likely to become different from those of the remaining regular memory cells, due to a change in size or shape caused by lithography and etching for the backing cells. Thus, it is desirable that the backing cell has a structure and a layout configuration possibly similar to those of the regular memory cell. The present invention proposes a memory cell structure where a backing cell is formed in a structure and a layout configuration possibly similar to those of a regular memory cell, so that a substantially low-resistance bit line is provided without adversely affecting characteristics of a part of the regular memory cells adjacent to the backing cells.

First Embodiment

A first embodiment of the present invention shows an SGT-DRAM in which a structure and a layout configuration for a selection transistor and a capacitance element in a backing cell section are set to be exactly the same as those in a regular memory cell section, so that characteristics of a part of a plurality of regular memory cells adjacent to the backing cell section are not adversely affected (e.g., changed) by formation of the backing cell section.

Figure 1:
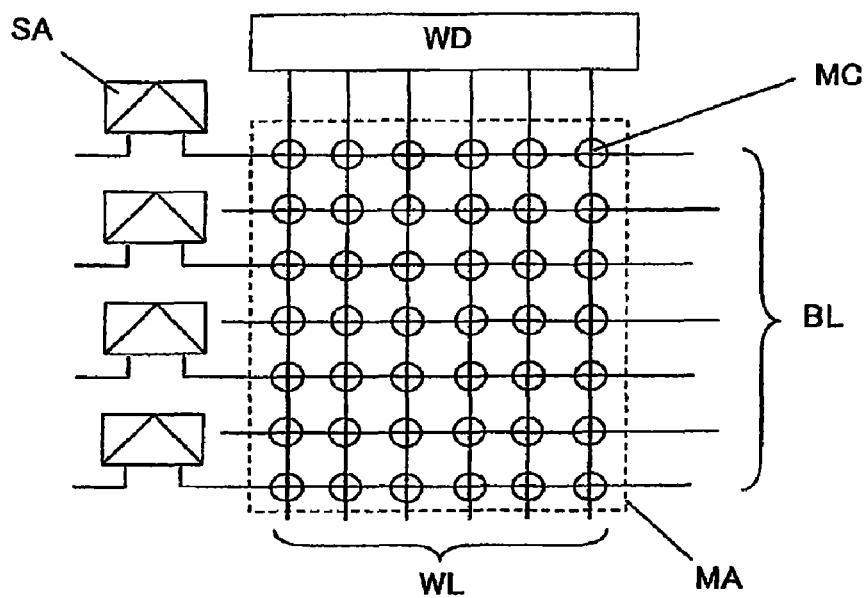
FIG. 1 is a diagram showing an equivalent circuit of a memory cell array and a peripheral circuit in a conventional SGT-DRAM.
Figure 2:
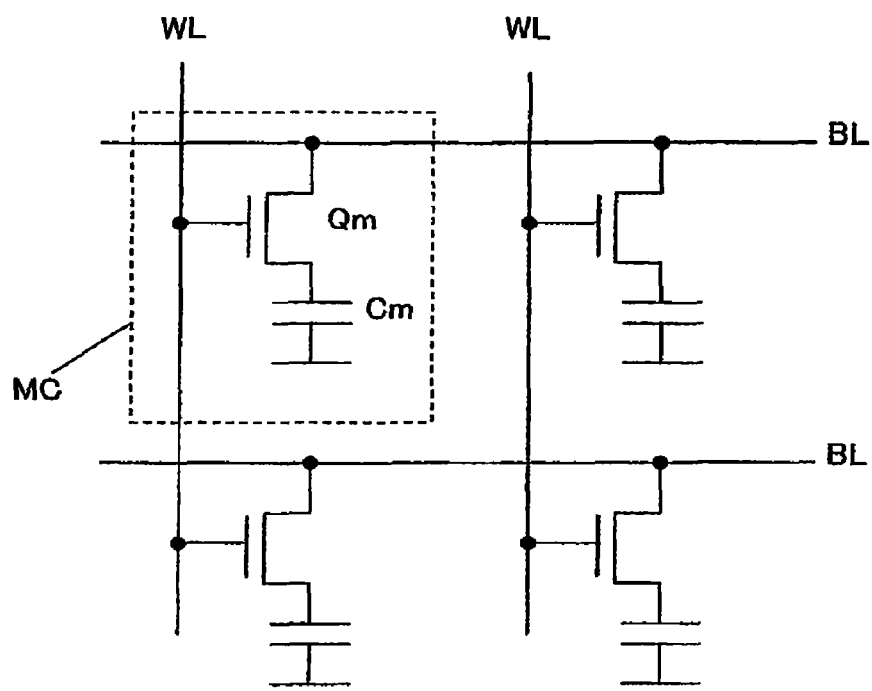
FIG. 2 is a diagram showing an equivalent circuit of a memory cell in the conventional SGT-DRAM.

FIG. 1 shows an equivalent circuit of a memory cell array and a part of peripheral circuits in a conventional cross-point type SGT-DRAM. A memory cell is formed at each of all intersections of a plurality of bit lines BL and a plurality of word lines WL. Each of the bit lines is connected to a corresponding one of a plurality of sense amplifiers SA as a peripheral circuit, and the word lines are connected to a word driver WD as another peripheral circuit. FIG. 2 shows an equivalent circuit of the memory cell formed at one of the intersections of the bit lines BL and the word lines WL. The regular memory cell MC comprises a single capacitance element Cm for accumulating electric charges therein, and a single selection transistor Qm for transferring electric charges. Specifically, the capacitance element Cm is operable to accumulate electric charges to store data therein. Subsequently, in response to turn-on of a corresponding one of the word lines WL each comprised of a gate electrode of the selection transistor Qm, the selection transistor Qm is operable to allow the data stored in the capacitance element Cm to be read out to a corresponding one of the bit lines BL. Then, the read signal is amplified by one of the sense amplifiers connected to the bit line.

Figure 3:
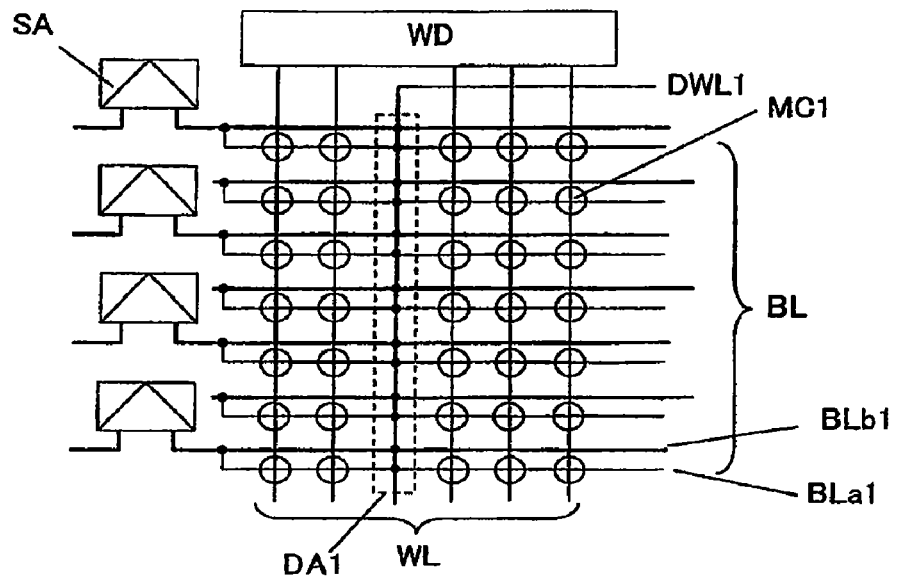
FIG. 3 is a diagram showing an equivalent circuit of a memory cell array and a peripheral circuit in an SGT-DRAM according to a first embodiment of the present invention.

FIG. 3 shows an equivalent circuit of a memory cell array and a part of peripheral circuits in an SGT-DRAM according to a first embodiment of the present invention. As seen in this equivalent circuit, a plurality of high-resistance bit lines BLa1 each comprised of an $N^+$ diffusion layer are backed with respective ones of a plurality of low-resistance bit lines BLb1 each comprised of a low-resistance material, such as metal, to provide substantially low-resistance bit lines. Each of the bit lines is backed with a corresponding one of a plurality of backing cells formed in a backing cell section DA1 within the memory cell array.

Figure 4:
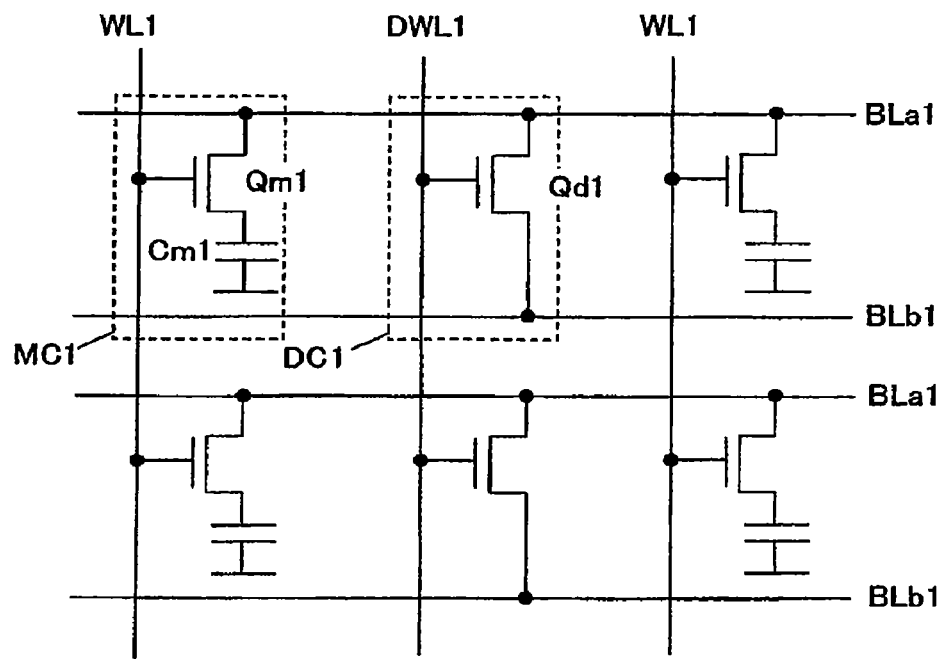
FIG. 4 is a diagram showing an equivalent circuit of a memory cell in the SGT-DRAM according to the first embodiment.

FIG. 4 shows an equivalent circuit of a regular memory cell MC1 and a backing cell DC1 in the first embodiment. The regular memory cell MC1 comprises a single capacitance element Cm1 for accumulating electric charges therein, and a single selection transistor Qm1 for transferring electric charges. Respective operations of the capacitance element Cm1 and the selection transistor Qm1 are the same as those of the capacitance element Cm and the selection transistor Qm in FIG. 2. The backing cell DC1 comprises a backing transistor Qd1 for connecting one of the high-resistance bit lines BLa1 comprised of an $N^+$ diffusion layer, and a corresponding one of the low-resistance bit lines BLb1. During an operation of the SGT-DRAM, a specific voltage is applied to a word line DWL1 for the backing transistor Qd1. In other words, the backing transistor Qd1 is kept in its ON state during the operation of the SGT-DRAM. Thus, the high-resistance bit line BLa1 and the low-resistance bit line BLb1 are connected to each other to provide a substantially low-resistance bit line.

Figure 5:
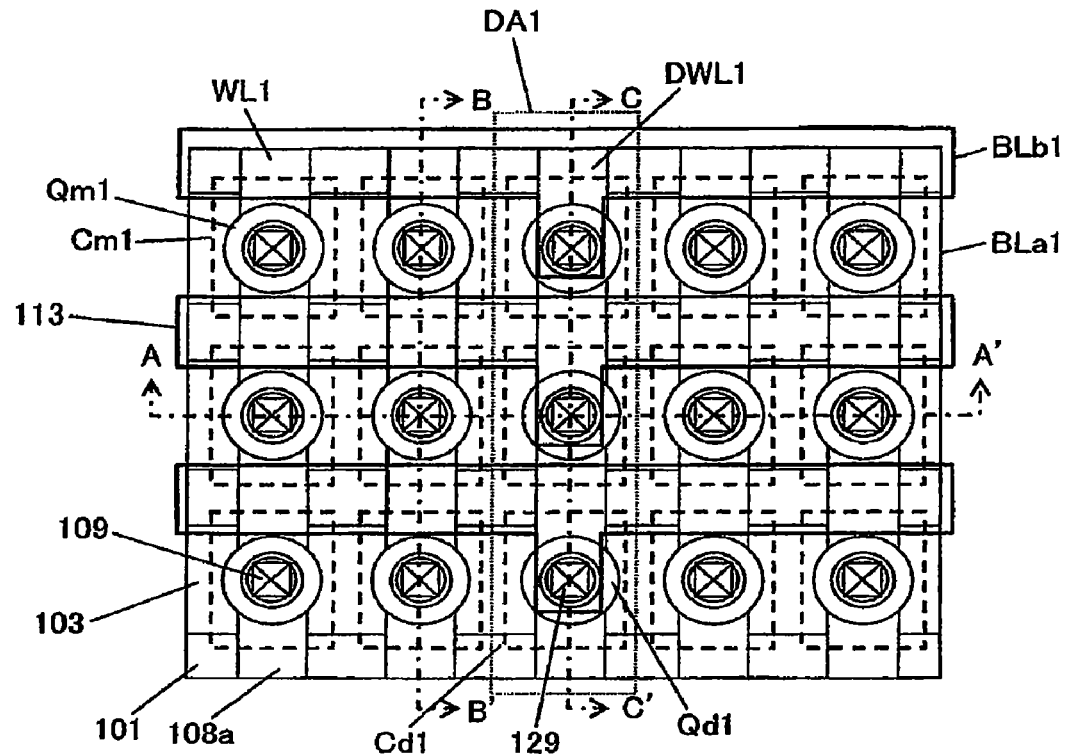
FIG. 5 is a top plan view showing the memory cell array in the SGT-DRAM according to the first embodiment.
Figure 6:
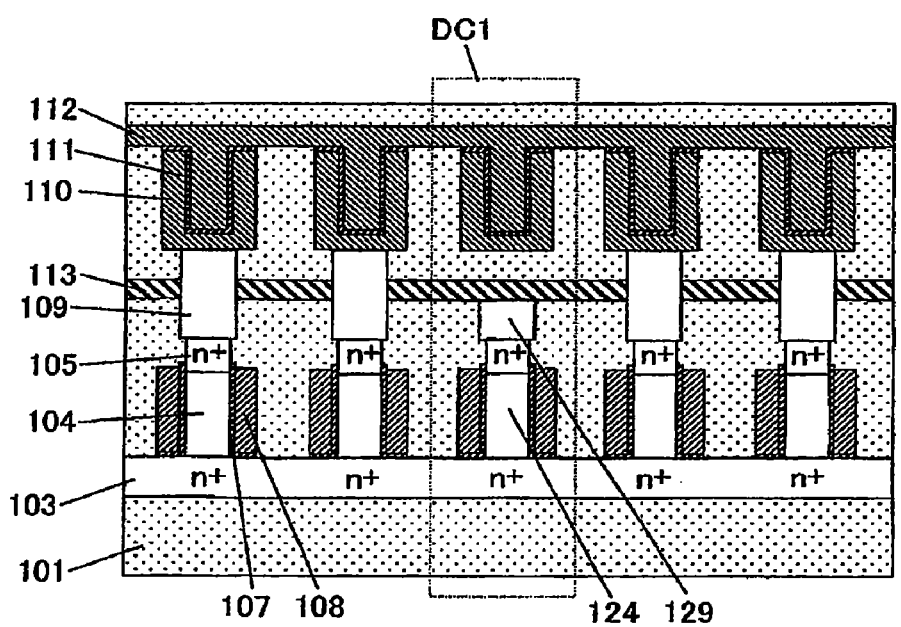
FIG. 6 is a sectional view showing the memory cell array in the SGT-DRAM according to the first embodiment.
Figure 7:
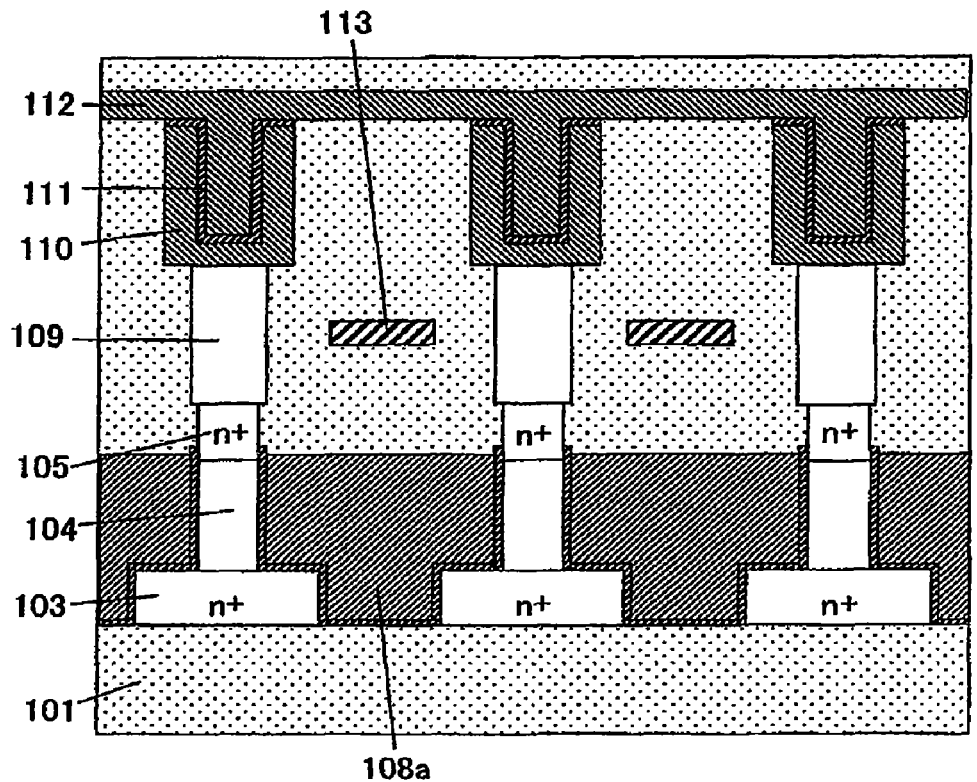
FIG. 7 is a sectional view showing the memory cell array in the SGT-DRAM according to the first embodiment.
Figure 8:
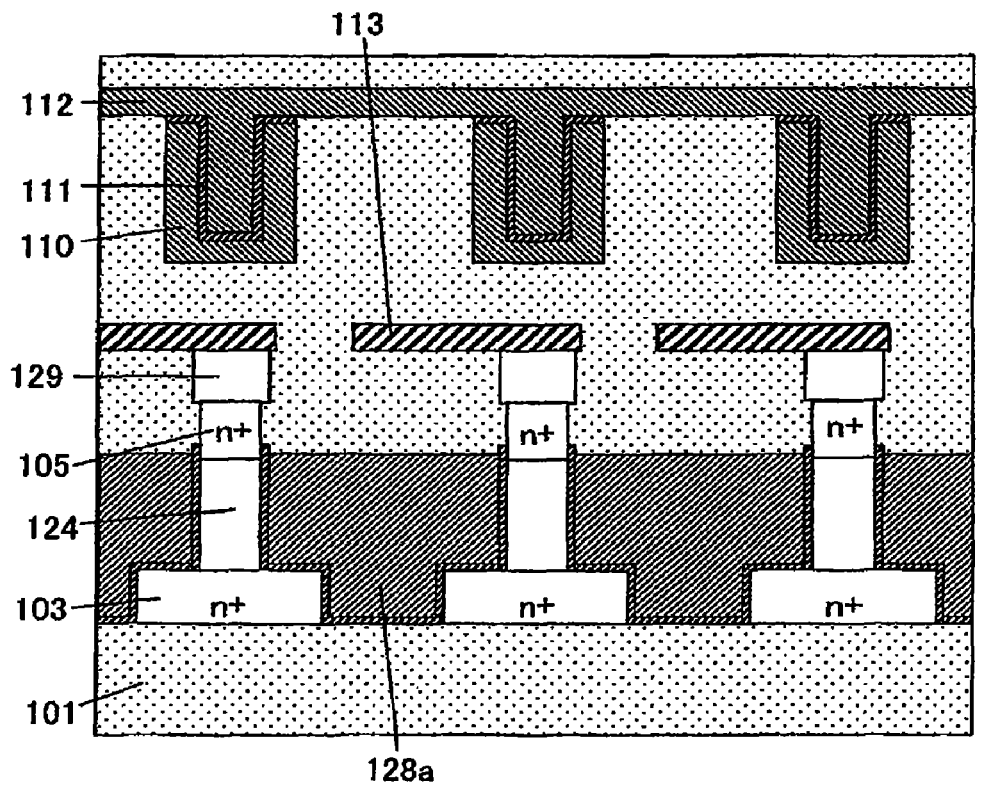
FIG. 8 is a sectional view showing the memory cell array in the SGT-DRAM according to the first embodiment.

FIG. 5 is a top plan view showing the memory cell array in the first embodiment, wherein a regular memory cell section and a backing cell section DA1 are illustrated. FIG. 6 is a sectional view of the regular memory cell section and the backing cell section DA1, taken along the line A-A' in FIG. 5. FIG. 7 is a sectional view of the regular memory cell section, taken along the line B-B' in FIG. 5, and FIG. 8 is a sectional view of the backing cell section, taken along the line C-C' in FIG. 5.

With reference to FIGS. 5 and 6, a top plan structure of the memory cell array will be described below. A high-resistance bit line BLa1 comprised of a lower diffusion layer 103 is wired on a buried oxide film 101 in a row direction.

In the regular memory cell section, a selection transistor Qm1 is formed on the lower diffusion layer 103 to allow access to a corresponding one of a plurality of regular memory cells. A gate dielectric film 107 and a gate electrode 108 are formed around a pillar-shaped silicon layer 104 constituting the selection transistor Qm1, and a regular word line WL1 comprised of a gate line 108a extending from the gate electrode of the selection transistor Qm1 is wired in a column direction. A capacitance contact 109 is formed on a top of the pillar-shaped silicon layer 104 of the selection transistor Qm1, and connected to a capacitance element Cm1.

In the backing cell section DA1, a backing transistor Qd1 is formed on the lower diffusion layer 103. A gate dielectric film 107 and a gate electrode 108 are formed around a pillar-shaped silicon layer 124 constituting the backing transistor Qd1, and a backing word line DWL1 comprised of a gate line 128a extending from the gate electrode of the backing transistor Qd1 is wired in the column direction. A bit-line contact 129 is formed on a top of the pillar-shaped silicon layer 124 of the backing transistor Qd1, and connected to a low-resistance bit line 113 (BLb1) comprised of a metal film. The low-resistance bit line BLb1 is wired in the row direction while avoiding contact with the capacitance contact 109 formed in the regular memory cell. As above, the high-resistance bit line BLa1 comprised of the lower diffusion layer 103 is backed with the low-resistance bit line BLb1 through the backing transistor Qd1.

In the backing cell section, a structure and a layout configuration for a transistor and a capacitance element are set to be exactly the same as those in the regular memory cell section, so that formation of the backing cell section causes no change in characteristics of the selection transistor or the capacitance element in a part of the regular memory cells adjacent to the backing cell section. Thus, each of the high-resistance bit lines can be backed with a corresponding one of the low-resistance bit lines through the backing cell section to provide a substantially low-resistance bit line, while minimizing an increase in chip area, i.e., limiting an additional area to only an area of the backing cell section.

With reference to FIGS. 6 to 8, a cross-section structure of the memory cell array will be described below.

A lower diffusion layer (first layer) 103 serving as a high-resistance bit line BLa1 is formed on a buried oxide film 101. In a regular memory cell section illustrated in FIGS. 6 and 7, a selection transistor Qm1 is formed on the lower diffusion layer 103 to allow access to a corresponding one of the regular memory cells. A gate dielectric film 107 and a gate electrode 108 are formed around a pillar-shaped silicon layer 104 constituting the selection transistor Qm1, and a gate line 108a is formed to extend from the gate electrode to serve as a regular word line WL1. An upper diffusion layer 105 is formed in an upper portion of the pillar-shaped silicon layer 104 of the selection transistor Qm1, and a capacitance contact 109 is formed on the upper diffusion layer 105 and connected to a capacitance element Cm1. The capacitance element Cm1 comprises a lower electrode 110, a capacitance dielectric film 111, and an upper electrode 112.

In a backing cell section DA1 illustrated in FIGS. 6 and 8, a backing transistor Qd1 is formed on the lower diffusion layer 103. A gate dielectric film 107 and a gate electrode 108 are formed around a pillar-shaped silicon layer 124 constituting the backing transistor Qd1, and a gate line 128a is formed to extend from the gate electrode to serve as a backing word line DWL1. An upper diffusion layer 105 is formed in an upper portion of the pillar-shaped silicon layer 124 of the backing transistor Qd1, and a bit-line contact 129 is formed on the upper diffusion layer 105. The bit-line contact 129 is connected to a low-resistance bit line 113 (BLb1) comprised of a metal film (second layer). A dummy capacitance element Cd1 is formed just above the low-resistance bit line to maintain layout regularity of the capacitance elements.

With reference to FIGS. 9 to 22, one example of a production method for the SGT-DRAM according to the first embodiment will be described below. In FIGS. 9 to 23, the figure suffixed with (a) is a top plan view of a memory cell array. Further, the figure suffixed with (b) is a sectional view of a regular memory cell section and a backing cell section in the memory cell array, taken along the line A-A' in the figure suffixed with (a), and the figure suffixed with (c) is a sectional view of the regular memory cell section in the memory cell array, taken along the line B-B' in the figure suffixed with (a).

Figure 9:
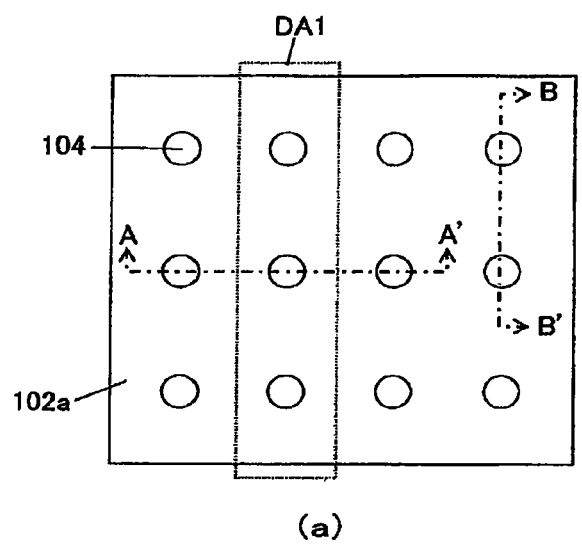
FIGS. 9(a) to 9(c) are process diagrams showing a production method for the SGT-DRAM according to the first embodiment, on a step-by-step basis.
Figure 9:
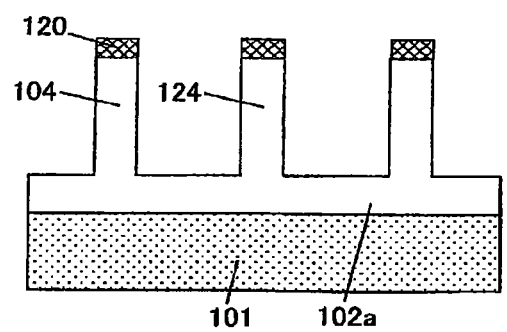
Figure 9:
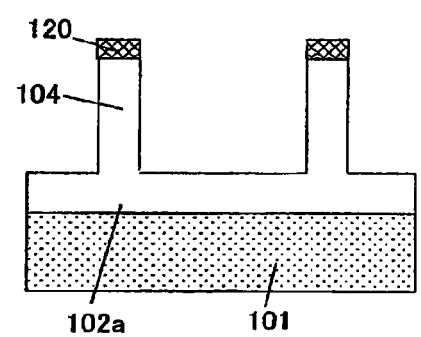
Figure 10:
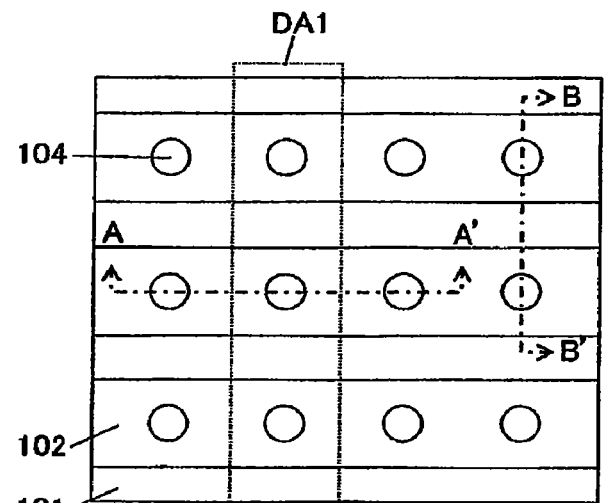
FIGS. 10(a) to 10(c) are process diagrams showing the production method for the SGT-DRAM according to the first embodiment, on a step-by-step basis.
Figure 10:
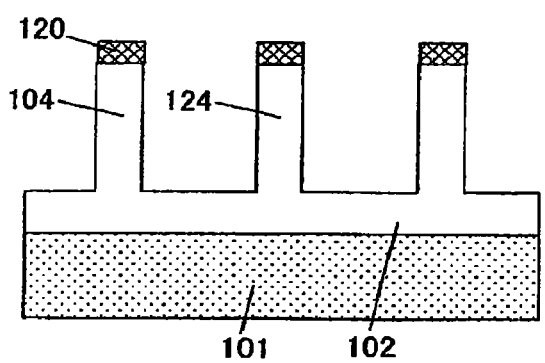
Figure 10:
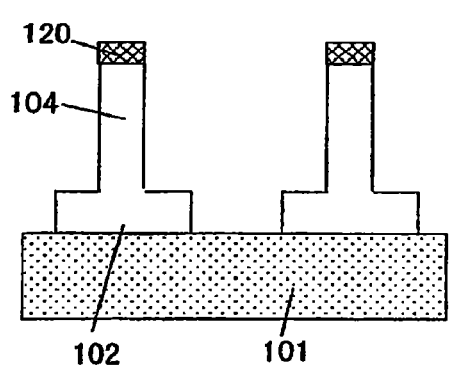
Figure 11:
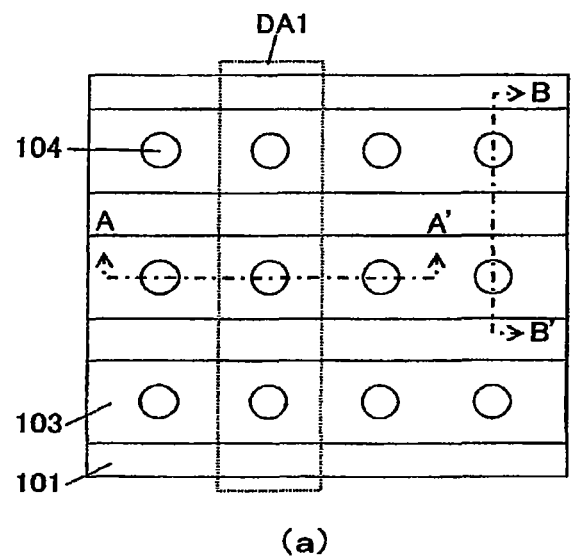
FIGS. 11(a) to 11(c) are process diagrams showing the production method for the SGT-DRAM according to the first embodiment, on a step-by-step basis.
Figure 11:
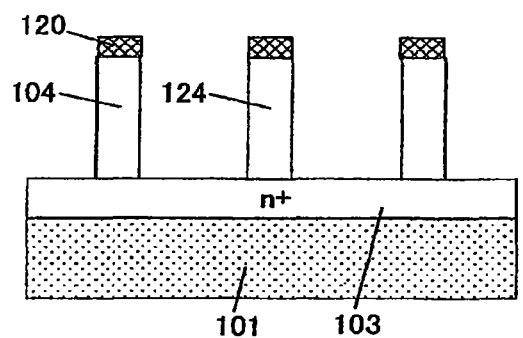
Figure 11:
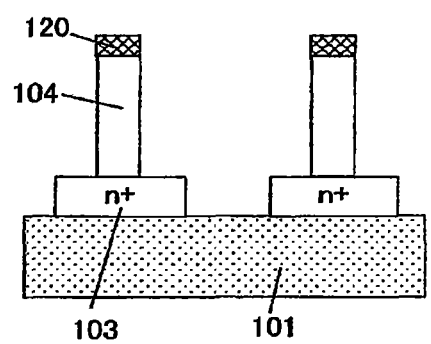
Figure 12:
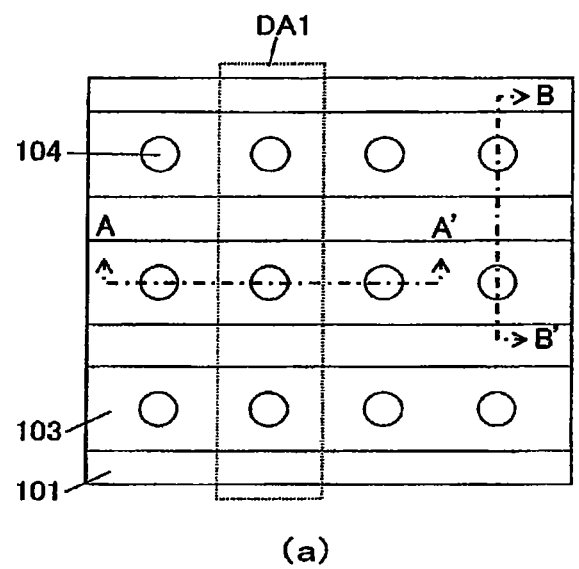
FIGS. 12(a) to 12(c) are process diagrams showing the production method for the SGT-DRAM according to the first embodiment, on a step-by-step basis.
Figure 12:
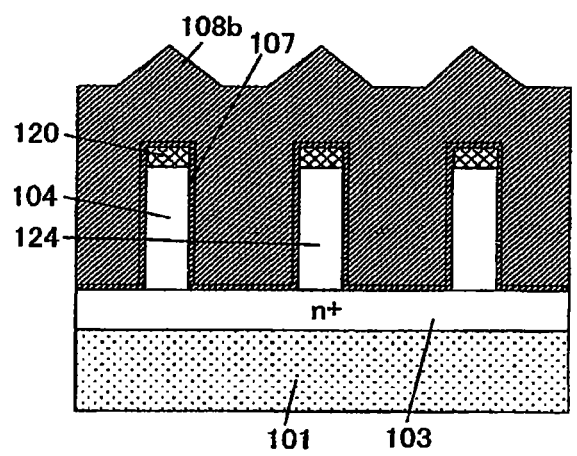
Figure 12:
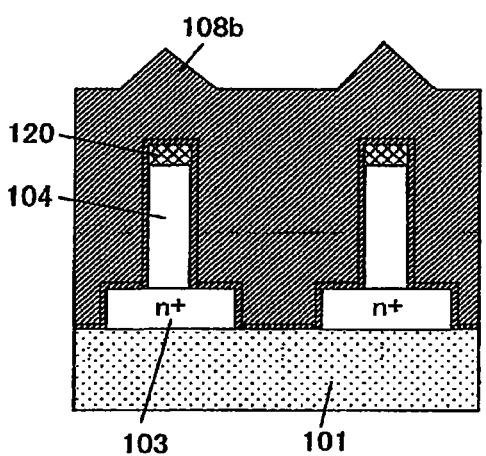
Figure 13:
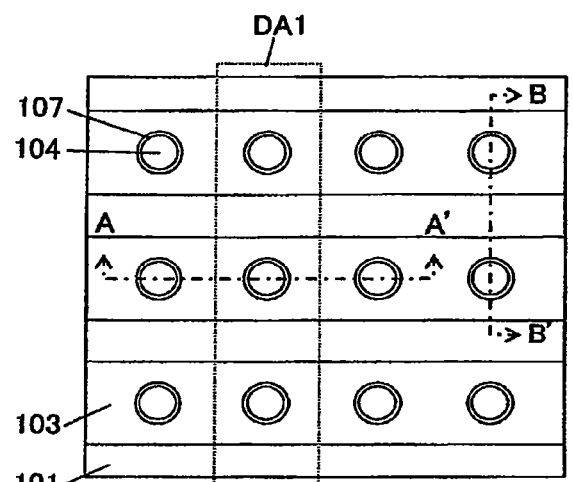
FIGS. 13(a) to 13(c) are process diagrams showing the production method for the SGT-DRAM according to the first embodiment, on a step-by-step basis.
Figure 13:
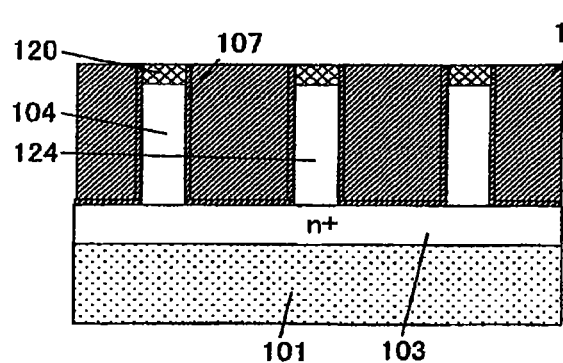
Figure 13:
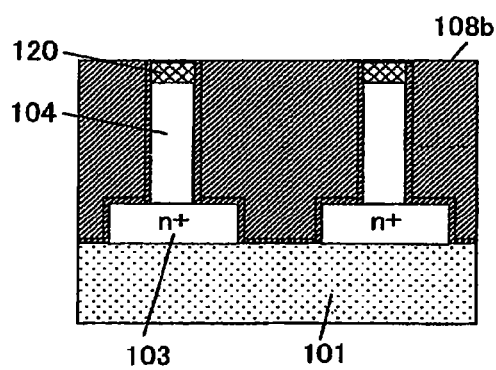
Figure 14:
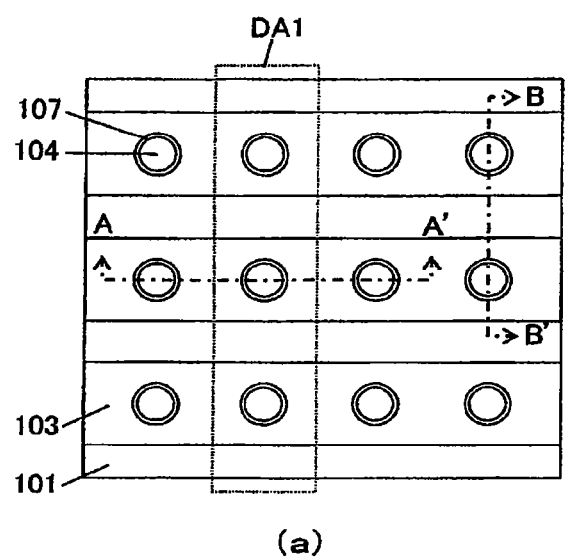
FIGS. 14(a) to 14(c) are process diagrams showing the production method for the SGT-DRAM according to the first embodiment, on a step-by-step basis.
Figure 14:
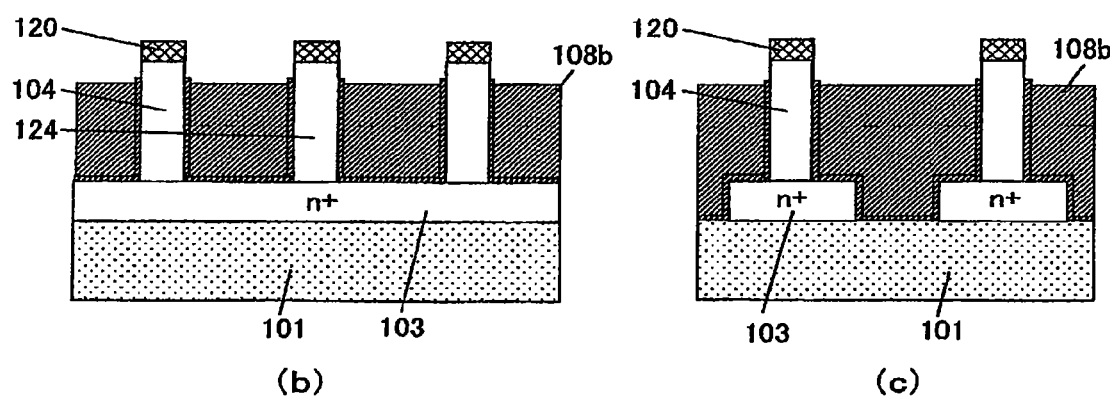
Figure 15:
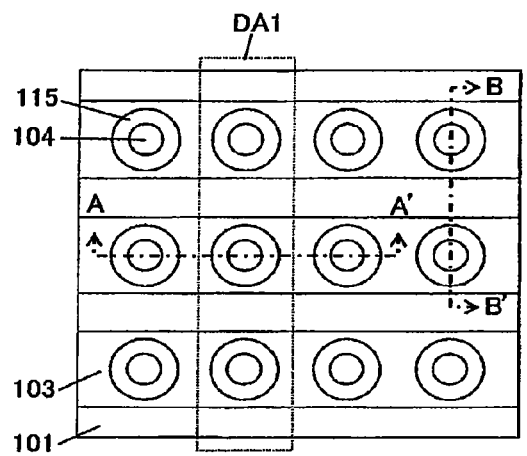
FIGS. 15(a) to 15(c) are process diagrams showing the production method for the SGT-DRAM according to the first embodiment, on a step-by-step basis.
Figure 15:
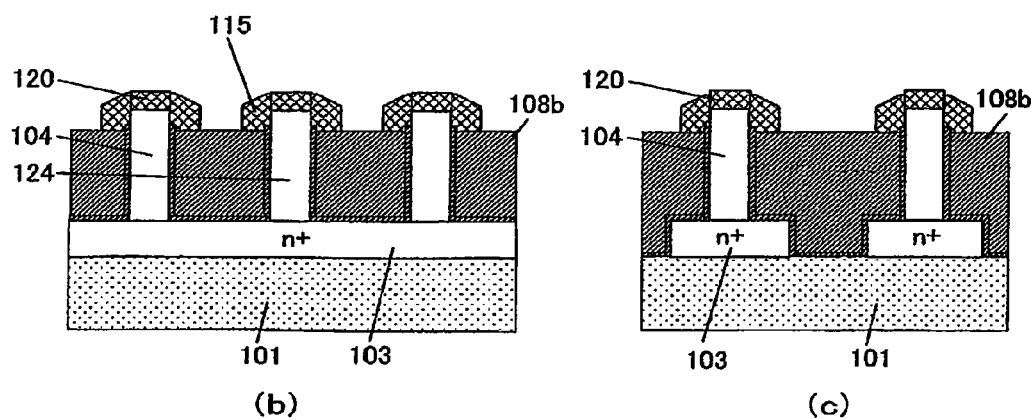
Figure 16:
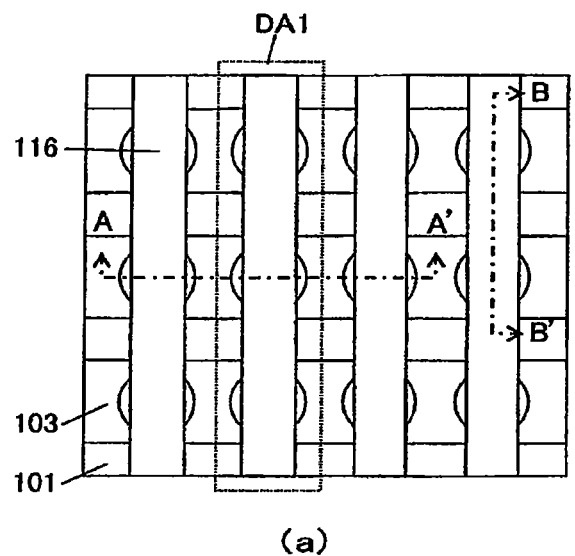
FIGS. 16(a) to 16(c) are process diagrams showing the production method for the SGT-DRAM according to the first embodiment, on a step-by-step basis.
Figure 16:
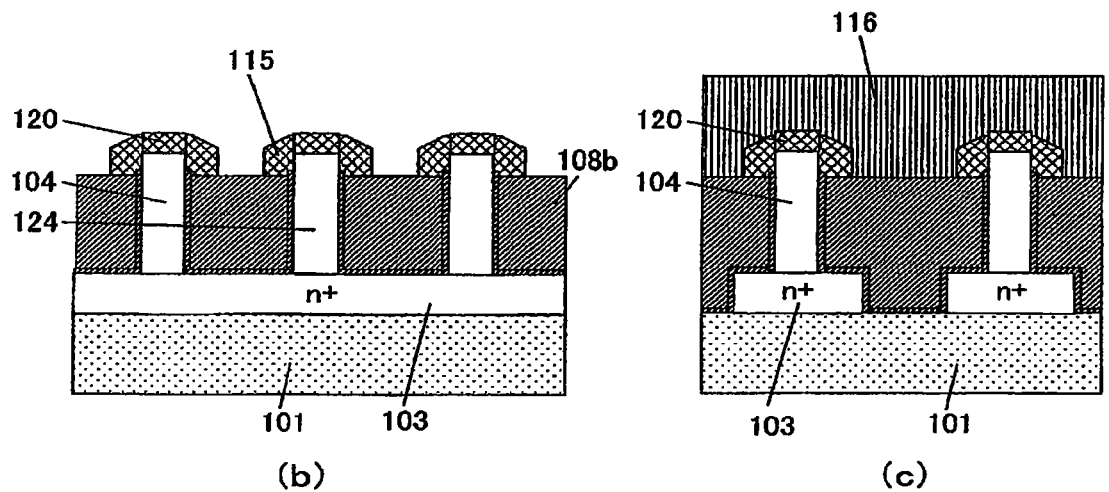
Figure 17:
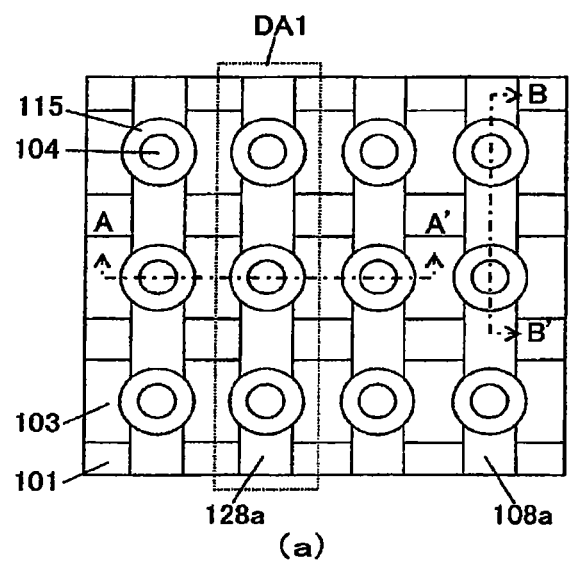
FIGS. 17(a) to 17(c) are process diagrams showing the production method for the SGT-DRAM according to the first embodiment, on a step-by-step basis.
Figure 17:
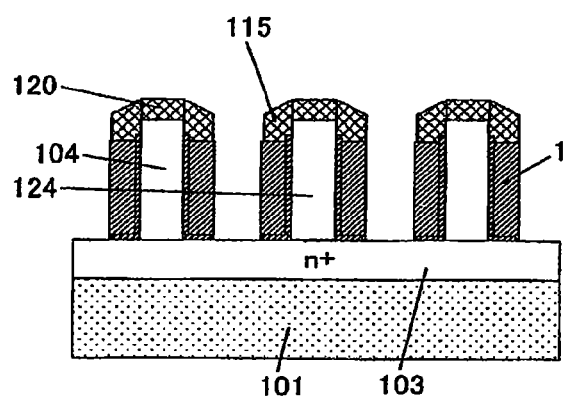
Figure 17:
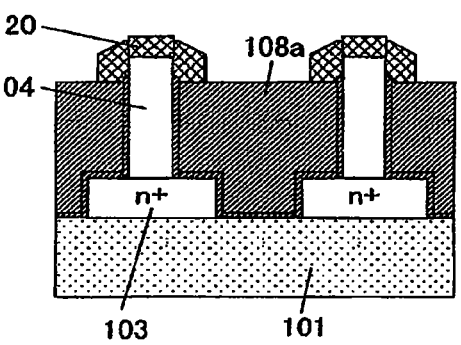
Figure 18:
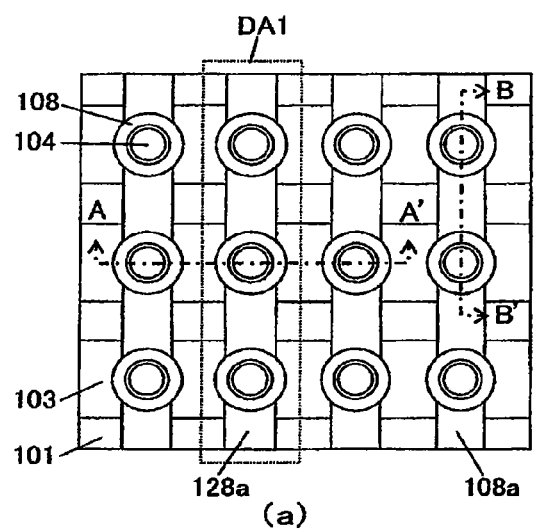
FIGS. 18(a) to 18(c) are process diagrams showing the production method for the SGT-DRAM according to the first embodiment, on a step-by-step basis.
Figure 18:
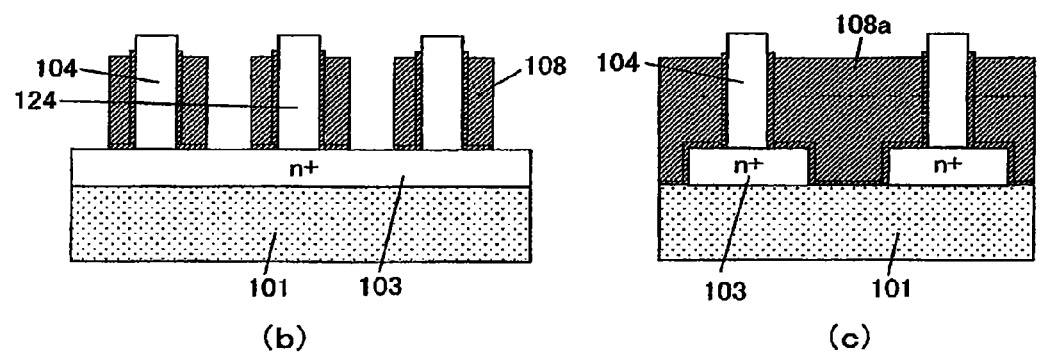
Figure 19:
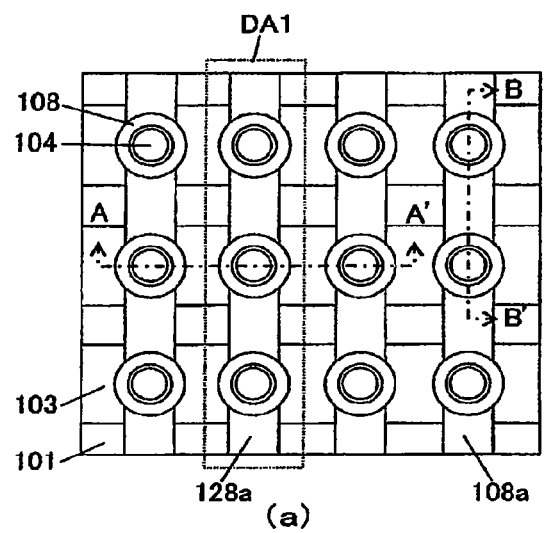
FIGS. 19(a) to 19(c) are process diagrams showing the production method for the SGT-DRAM according to the first embodiment, on a step-by-step basis.
Figure 19:
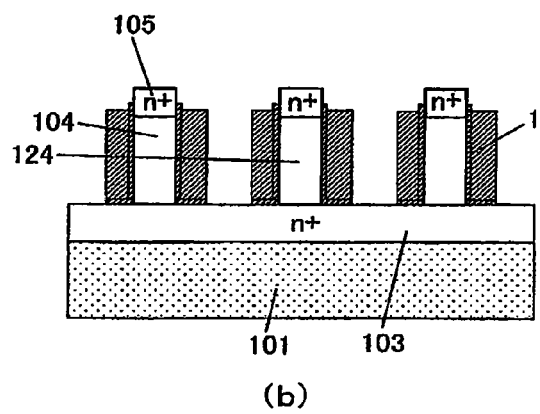
Figure 19:
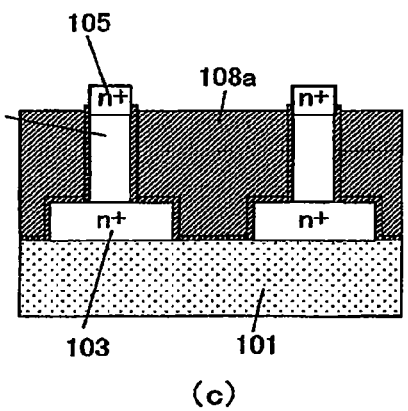
Figure 20:
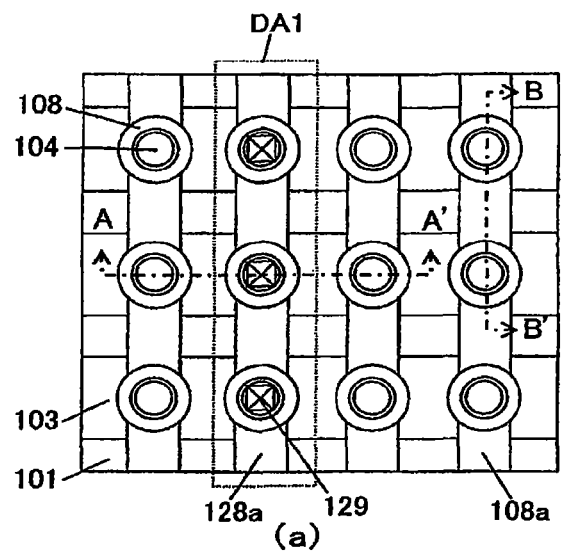
FIGS. 20(a) to 20(c) are process diagrams showing the production method for the SGT-DRAM according to the first embodiment, on a step-by-step basis.
Figure 20:
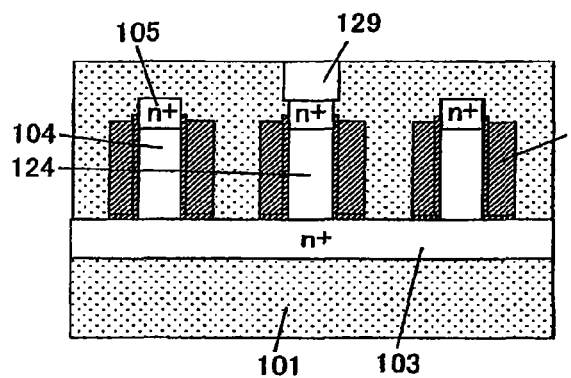
Figure 20:
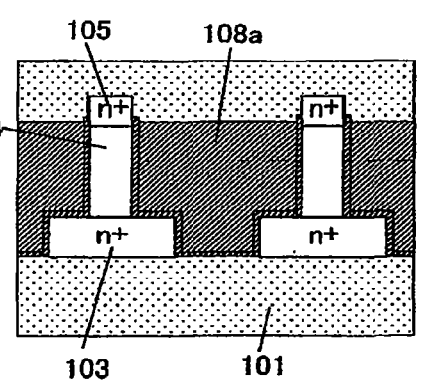
Figure 21:
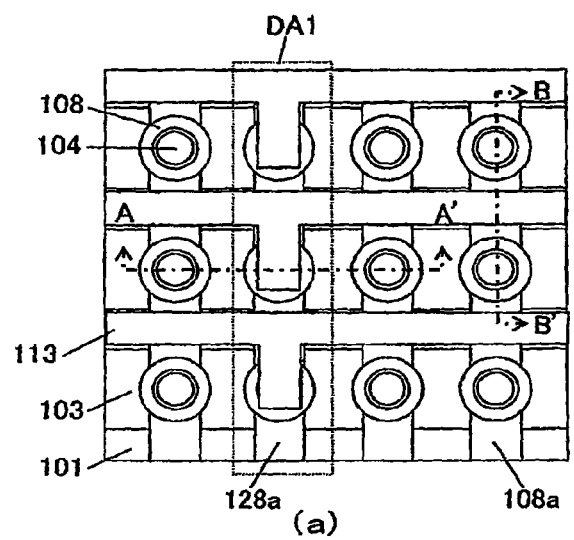
FIGS. 21(a) to 21(c) are process diagrams showing the production method for the SGT-DRAM according to the first embodiment, on a step-by-step basis.
Figure 21:
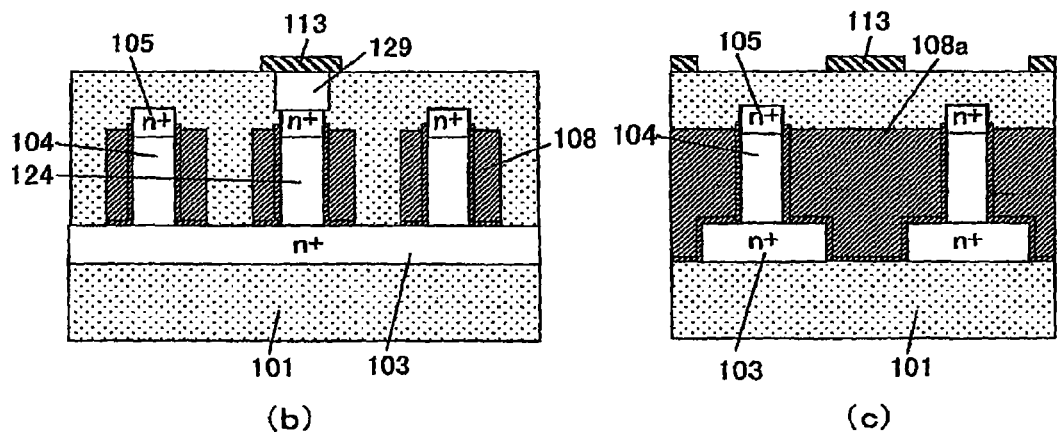
Figure 22:
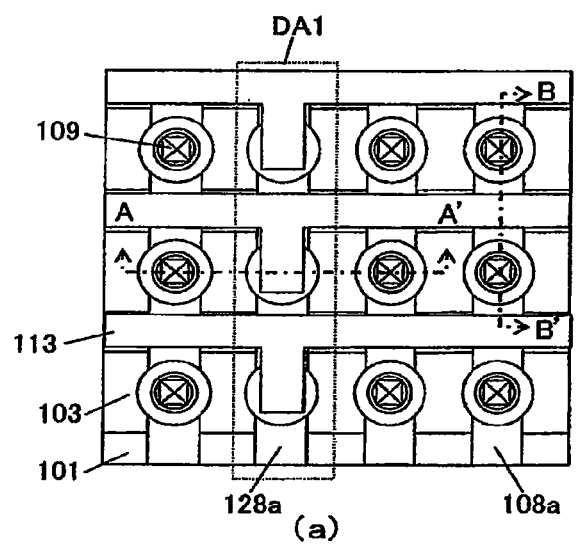
FIGS. 22(a) to 22(c) are process diagrams showing the production method for the SGT-DRAM according to the first embodiment, on a step-by-step basis.
Figure 22:
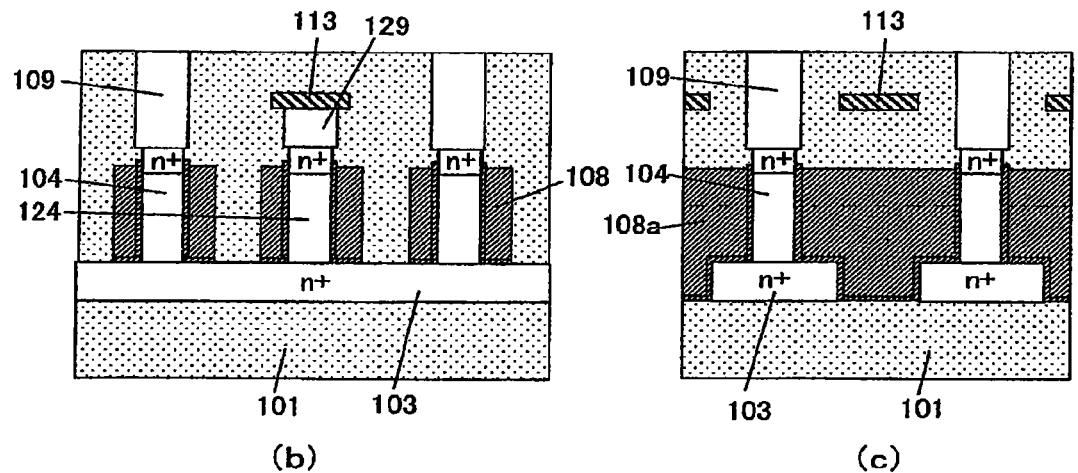
Figure 23:
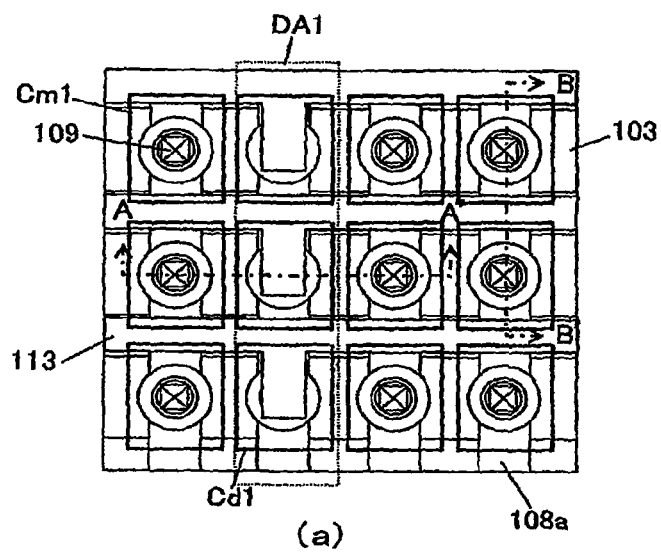
FIGS. 23(a) to 23(c) are process diagrams showing the production method for the SGT-DRAM according to the first embodiment, on a step-by-step basis.
Figure 23:
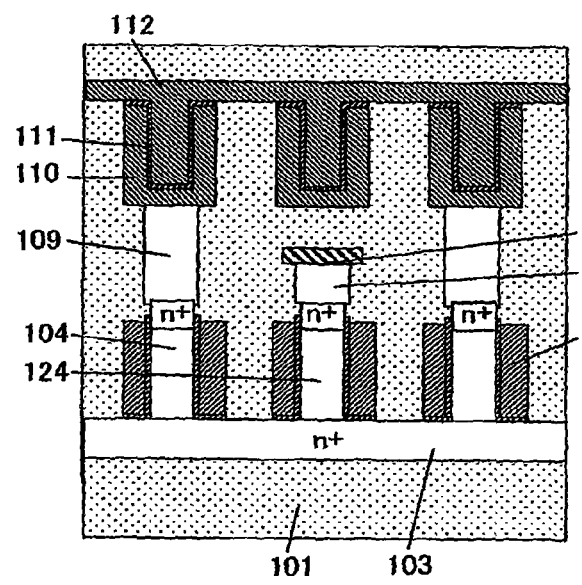
Figure 23:
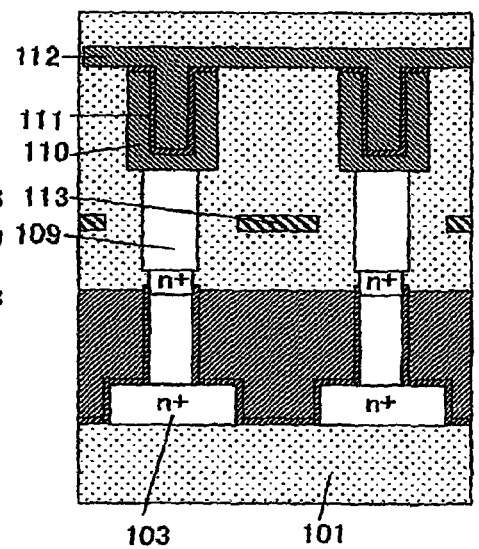

As shown in FIG. 9, an SOI (silicon-on-insulator) substrate is employed in which an SOI layer having a film thickness of about 200 nm is formed on a buried oxide film 101. A mask layer 120 of a silicon nitride film is formed on the SOI layer, and a selection-transistor pillar-shaped silicon layer (pillar-shaped silicon layer for a selection transistor) 104 and a backing-transistor pillar-shaped silicon layer (pillar-shaped silicon layer for a backing transistor) 124 are formed by lithographic pattering and etching. The selection-transistor pillar-shaped silicon layer 104 and the backing-transistor pillar-shaped silicon layer 124 are formed in exactly the same structure and layout configuration. This step is performed to allow a continuous planar silicon layer 102a to be formed underneath the pillar-shaped silicon layers after the etching.

As shown in FIGS. 10(a) to 10(c), the continuous planar silicon layer 102a is divided by etching to form a plurality of line-shaped planar silicon layers 102.

As shown in FIGS. 11(a) to 11(c), an impurity is implanted into each of the planar silicon layers by ion implantation or the like, to form an N+ lower diffusion layer 103 serving as a high-resistance bit line BLa1. Preferably, conditions for the implantation are adjusted to allow the impurity to be distributed to reach the buried oxide film 101 and cover a bottom of the pillar-shaped silicon layer. In this step, the silicon nitride film-based mask 120 prevents the impurity from being introduced into an upper portion of the pillar-shaped silicon layer.

As shown in FIGS. 12(a) to 12(c), a gate dielectric film 107 is formed, and then a gate conductive film 108b is formed to fill a space between the pillar-shaped silicon layers.

As shown in FIGS. 13(a) to 13(c), the gate conductive film 108b, and a portion of the gate dielectric film 107 above the pillar-shaped silicon layer, are polished by chemical mechanical polishing (CMP), to flatten a top surface of a gate. The flattening of the top surface of the gate by the CMP makes it possible to achieve an adequate gate configuration and suppress a variation in gate length. During the CMP, the silicon nitride film-based mask 120 on a top of the pillar-shaped silicon layer is used as a CMP stopper. The use of the silicon nitride film-based mask 120 as a CMP stopper makes it possible to control an amount of CMP with high repeatability.

As shown in FIGS. 14(a) to 14(c), the gate conductive film 108b is etched back to form a gate electrode on a sidewall of the pillar-shaped silicon layer so as to set a gate length. Conditions for the etching are adjusted to allow the gate conductive film 108b to be etched at a higher selectivity ratio relative to the silicon nitride film-based mask 120, so as to suppress a reduction of the silicon nitride film-based mask 120 to the minimum.

As shown in FIGS. 15(a) to 15(c), a silicon nitride film is formed and then etched back to form a silicon nitride film-based sidewall 115 on a top of the gate. In this step, a final film thickness of the silicon nitride film-based sidewall 115 after the etching-back is adjusted in such a manner that an amount of the silicon nitride film to be formed and an amount of the silicon nitride film to be etched back are set to allow the final film thickness of the silicon nitride film-based sidewall 115 to become equal to a film thickness of a gate electrode.

As shown in FIGS. 16(a) to 16(c), a resist or a multilayer resist is applied, and a pattern for a gate line, such as a word line, is formed using the resist 116 by lithography.

As shown in FIGS. 17(a) to 17(c), the gate conductive film and the gate dielectric film are etched using the resist 116 as a mask to form a gate electrode 108 and a gate line (108a, 128a).

As shown in FIGS. 18(a) to 18(c), the silicon nitride film 120 and the silicon nitride film-based sidewall 115 on the top and the upper portion of the pillar-shaped silicon layer are removed by wet etching or dry etching.

As shown in FIGS. 19(a) to 19(c), an impurity, such as phosphorus (P) or arsenic (As), is introduced into an upper portion of the pillar-shaped silicon layer by ion implantation or the like, to form an N+ upper diffusion layer 105 in the upper portion of the pillar-shaped silicon layer.

As shown in FIGS. 20(a) to 20(c), a silicon oxide film serving as an interlayer film is formed, and then a bit-line contact 129 is formed on a top of the backing-transistor pillar-shaped silicon layer 124.

As shown in FIGS. 21(a) to 21(c), a low-resistance bit-line material comprised of a metal film is formed as a continuous film. The continuous film is subjected to lithography and etching to form a bit line 113. The bit line 113 is formed at a position between adjacent capacitance contacts to be formed in a next step, in such a manner that it is connected to the bit-line contact 129 while being kept from contacting the capacitance contacts.

As shown in FIGS. 22(a) to 22(c), a silicon oxide film serving as an interlayer film is formed, and then a capacitance contact 109 is formed on a top of each of the selection-transistor pillar-shaped silicon layers 104 in a regular memory cell section.

As shown in FIGS. 23(a) to 23(c), a capacitance element comprising a lower electrode 110, a dielectric film 111 and an upper electrode 112 is formed in the same manner as that in a conventional stacked DRAM. In a backing cell section, a dummy capacitance element is formed just above each of the backing-transistor pillar-shaped silicon layers 124 to maintain regularity of the capacitance elements in the memory cell array.

As above, in the first embodiment, a structure and a layout configuration for a pillar-shaped silicon layer and a capacitance element in the backing cell section are exactly the same as those in the regular memory cell section. Thus, characteristics of a part of the regular memory cells adjacent to the backing cell section are never adversely affected by formation of the backing cell section, so that each of the high-resistance bit lines can be backed with a corresponding one of the low-resistance bit lines through the backing cell section to provide a substantially low-resistance bit line, while minimizing an increase in chip area, i.e., limiting an additional area to only an area of the backing cell section.

Figure 24:
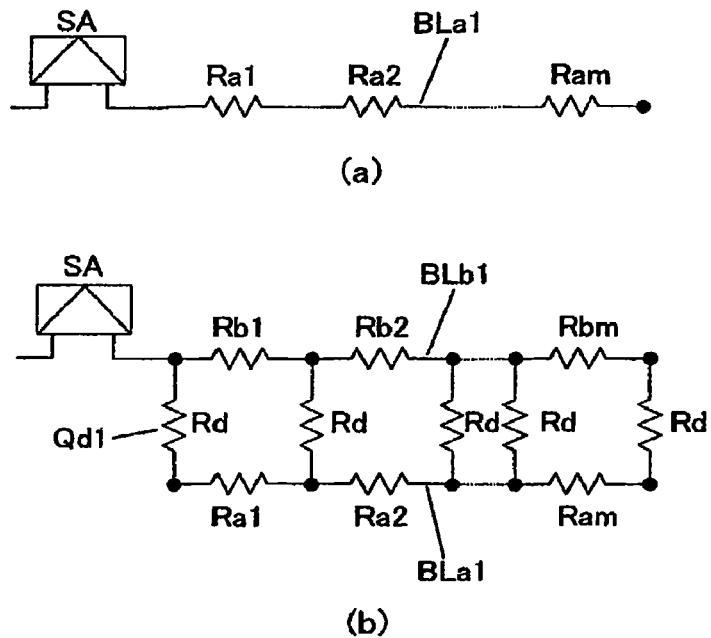
FIGS. 24(a) and 24(b) are schematic diagrams for explaining respective bit-line resistances in the SGT-DRAM according to the first embodiment and the conventional SGT-DRAM in a comparative manner.

As a prerequisite to ensuring a stable operation of the DRAM according to the first embodiment, it is necessary to set a substantial bit-line resistance to be equal to or less than a maximum value (Rmax) of a bit-line resistance to be estimated from a capability of a sense amplifier. FIG. 24(a) is a schematic diagram showing a bit-line resistance in a conventional DRAM, and FIG. 24(b) is a schematic diagram showing a bit-line resistance in the DRAM according to the first embodiment. In FIG. 24(b), given that a row of n memory cells is backed with one backing cell, a resistance value of a high-resistance bit line (BLa1) and a resistance value of a low-resistance bit line (BLb1) for each of the n memory cells are indicated, respectively, by Ra=Ra1=Ra2=- - - -=Ram, and Rb=Rb1=Rb2=- - - -=Rbm, and an ON-resistance of each of a backing transistor and a selection transistor is indicated by Rd. The number of memory cells connected to one bit line is indicated by m×n.

In the conventional DRAM illustrated in FIG. 24(a), a total bit-line resistance between a nearest memory cell and a farthest memory cell from a sense amplifier (SA) is m×Ra. In most of typical DRAMs, about 256 memory cells are connected to one bit line, so that the bit-line resistance m×Ra has a large value. Thus, the following relation: Rmax>m×Ra, can be satisfied only if the number of memory cells to be connected to one bit line is drastically reduced.

In the first embodiment illustrated in FIG. 24(b), the following relation: Ra>>Rb, is established between the resistance Ra of the high-resistance bit line comprised of a diffusion layer and the resistance Rb of the low-resistance bit line comprised of a metal. Thus, electric charges read out from the capacitance element reach the sense amplifier via the low-resistance bit line, so that a total bit-line resistance between a nearest memory cell and a farthest memory cell from the sense amplifier (SA) is generally expressed by the following formula: (m−1)×Rb+Rd+Ra/2. Among the values (m×Rb), Rd and Ra/2 in this formula, a value adjustable with less adverse effects on a circuit configuration is Ra. Thus, in order to satisfy the above relational formula, a value of Ra, i.e., a value of n, has to be optimally adjusted. As the value of n is increased, the bit-line resistance becomes larger although an area efficiency of memory cells is improved, whereas, as the value of n is reduced, the bit-line resistance becomes smaller although the area efficiency of memory cells becomes deteriorated. Thus, it is necessary to optimize the value of n, while taking into account a trade-off between the use efficiency of memory cells and the bit-line resistance. This optimization technique may be applied to not only the first embodiment but also the following embodiments.

Preferably, in the first embodiment, a cell located at an outermost position of the memory cell array is used as a backing cell. The outermost cell has been generally not used as a memory cell, because it has characteristic different from other cells located inside the memory cell array due to irregularity in layout. The technique of using the outermost cell as a backing cell makes it possible to facilitate effective utilization of the outermost cell which has otherwise been arranged as a dummy pattern constituting a factor causing an increase in chip area.

Second Embodiment

In the first embodiment, a high-resistance bit line is backed with a dedicated low-resistance bit-line layer formed within a memory cell array to provide a substantially low-resistance bit line. A second embodiment of the present invention shows an SGT-DRAM structure in which a high-resistance bit line comprised of a diffusion layer is backed with a first-layer interconnection line shared with a peripheral circuit. In the second embodiment, a need for forming a dedicated bit-line layer within a memory cell array can be eliminated to reduce the number of production steps.

Although a structure and a layout configuration for a transistor in a backing cell section is the same as those in a regular memory cell section, a structure and a layout configuration for a capacitance element becomes irregular in the backing cell section, because no capacitance element is formed in the backing cell section. Thus, characteristics of a capacitance element in a part of a plurality of regular memory cells adjacent to the backing cell section are likely to become different from those in the remaining regular memory cells. However, the structure and layout configuration of the capacitance element in a part of the regular memory cells adjacent to the backing cell section can be set to conform to those in the remaining regular memory cells by optimizing OPC (optical proximity correction) and/or adjusting etching conditions An equivalent circuit of each of the memory cell array and the memory cell, and a mechanism for providing a substantially low-resistance bit line based on backing, in the second embodiment, are the same as those in the first embodiment.

Figure 25:
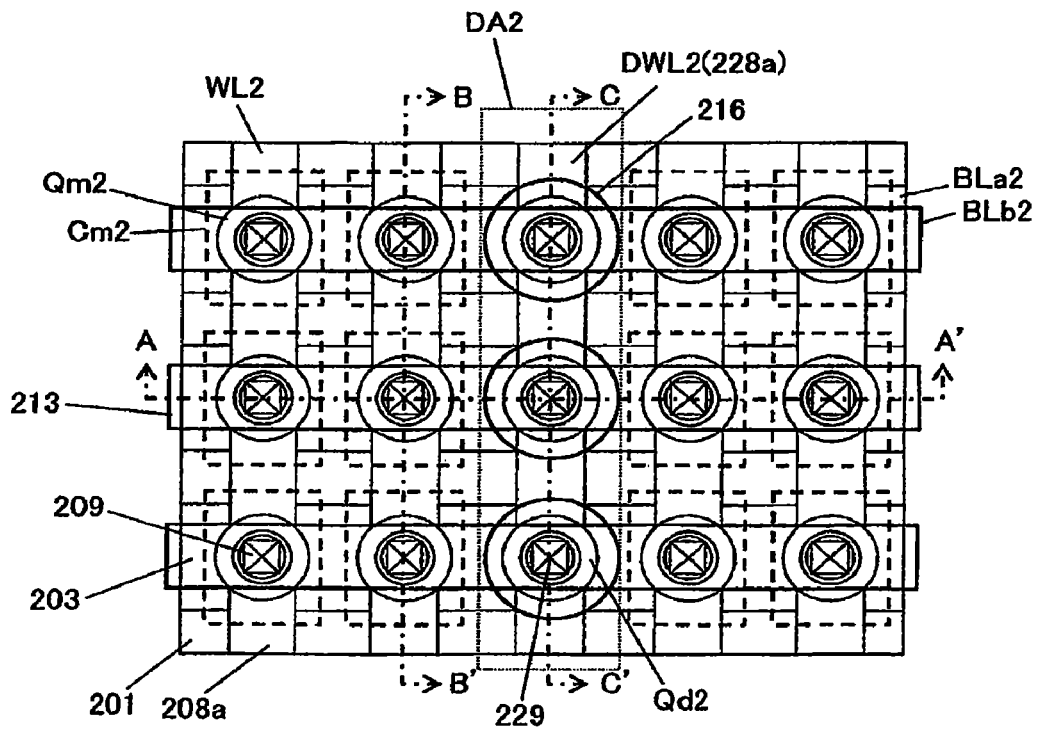
FIG. 25 is a top plan view showing a memory cell array in an SGT-DRAM according to a second embodiment of the present invention.
Figure 26:
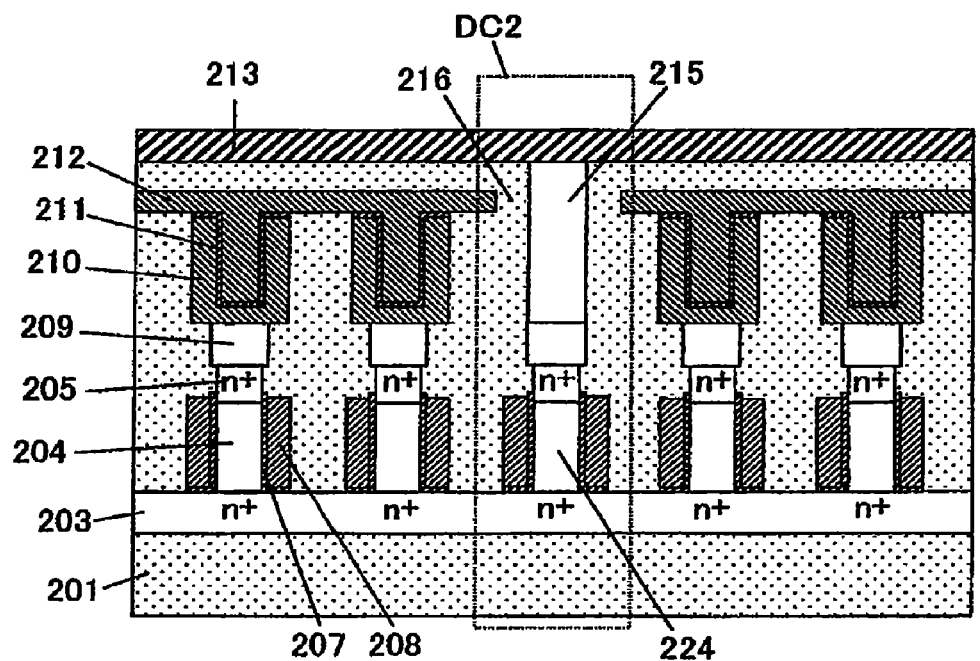
FIG. 26 is a sectional view showing the memory cell array in the SGT-DRAM according to the second embodiment.
Figure 27:
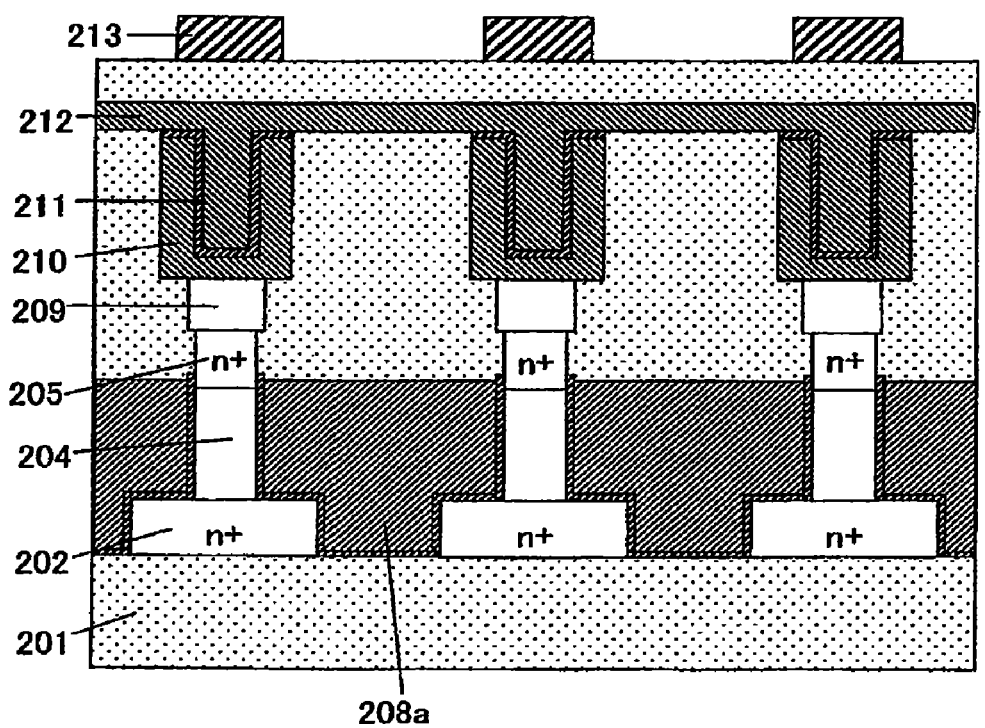
FIG. 27 is a sectional view showing the memory cell array in the SGT-DRAM according to the second embodiment.
Figure 28:
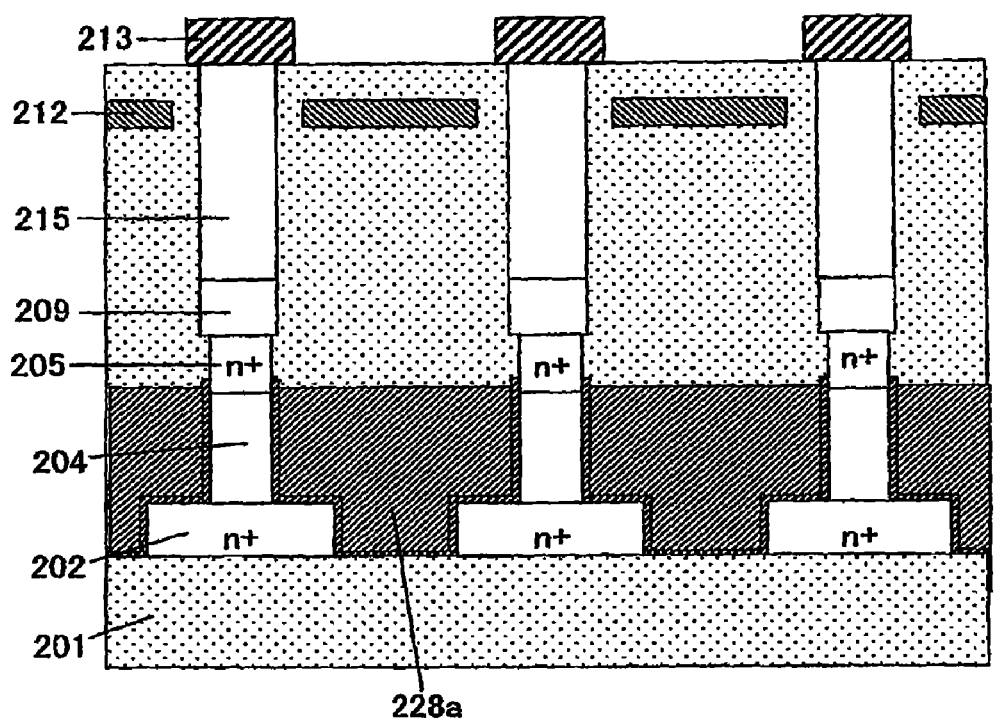
FIG. 28 is a sectional view showing the memory cell array in the SGT-DRAM according to the second embodiment.
Figure 29:
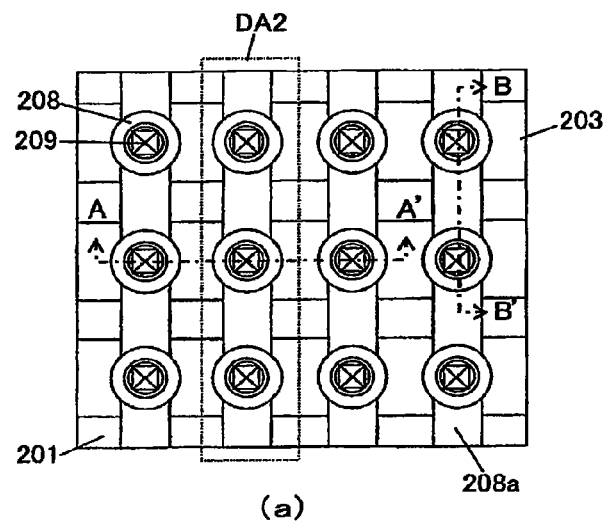
FIGS. 29(a) to 29(c) are process diagrams showing a production method for the SGT-DRAM according to the second embodiment, on a step-by-step basis.
Figure 29:
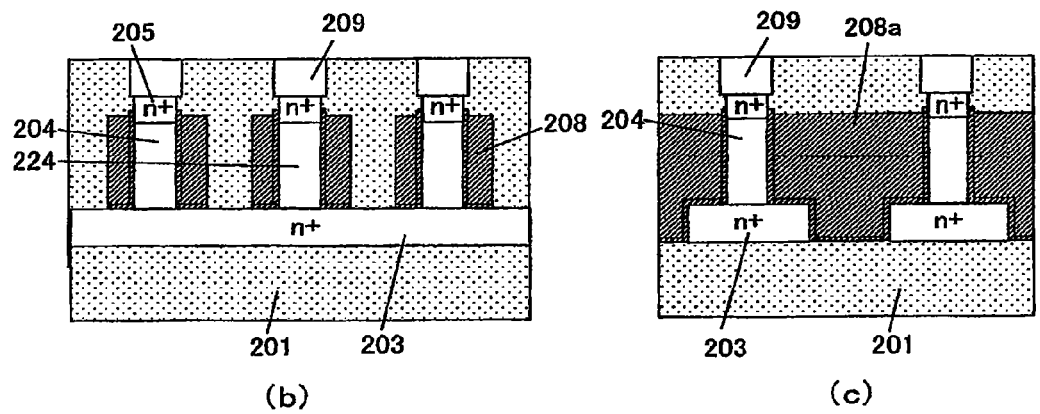
Figure 30:
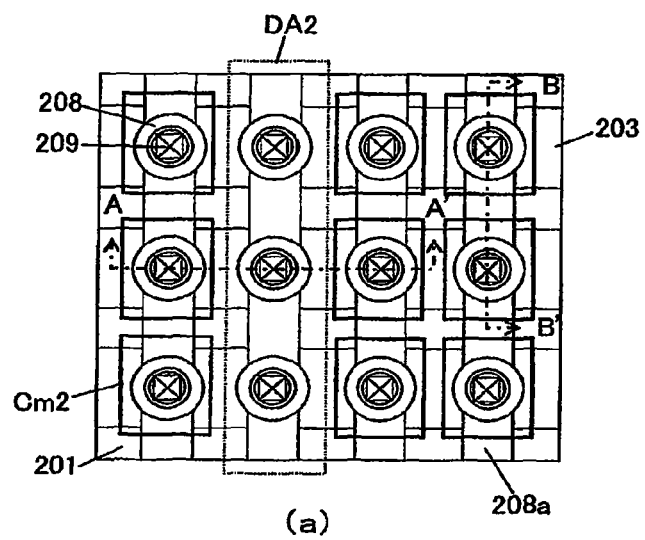
FIGS. 30(a) to 30(c) are process diagrams showing the production method for the SGT-DRAM according to the second embodiment, on a step-by-step basis.
Figure 30:
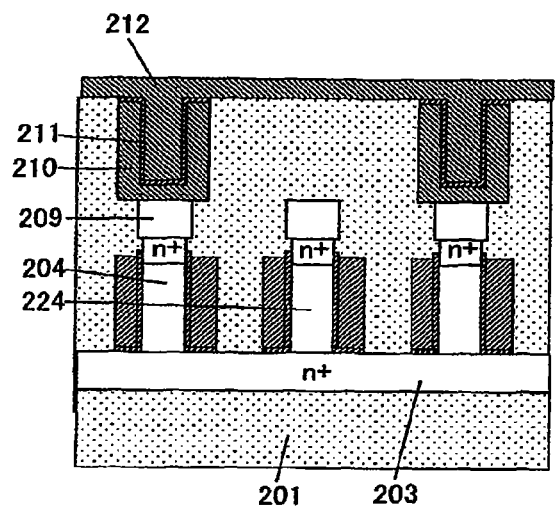
Figure 30:
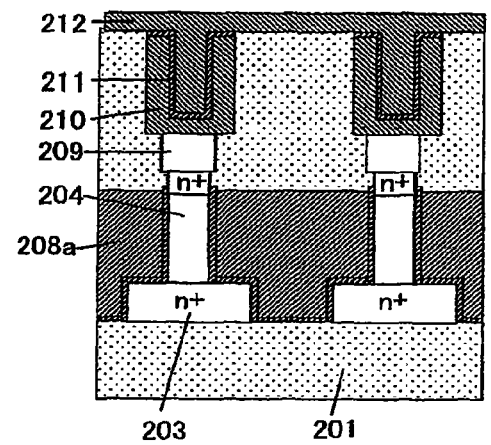
Figure 31:
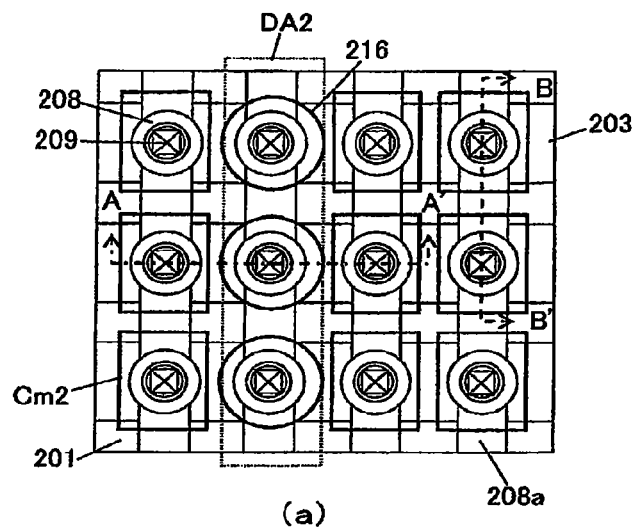
FIGS. 31(a) to 31(c) are process diagrams showing the production method for the SGT-DRAM according to the second embodiment, on a step-by-step basis.
Figure 31:
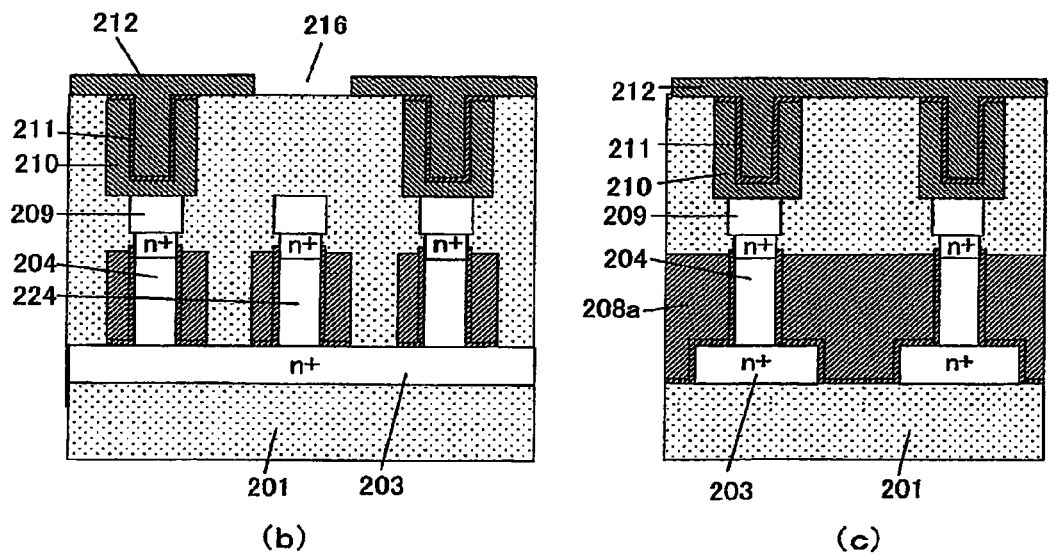
Figure 32:
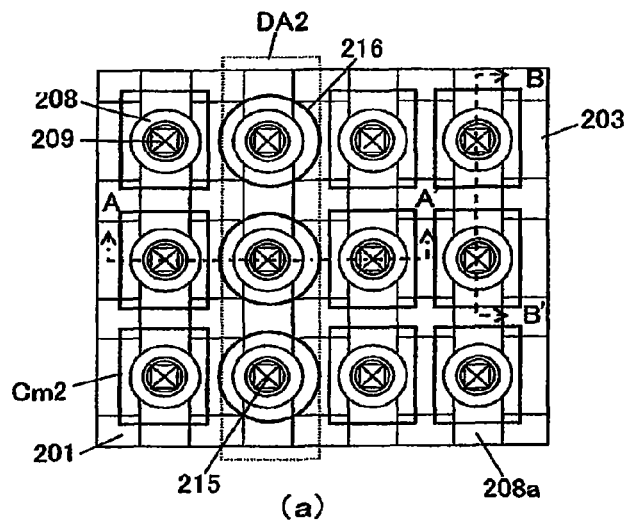
FIGS. 32(a) to 32(c) are process diagrams showing the production method for the SGT-DRAM according to the second embodiment, on a step-by-step basis.
Figure 32:
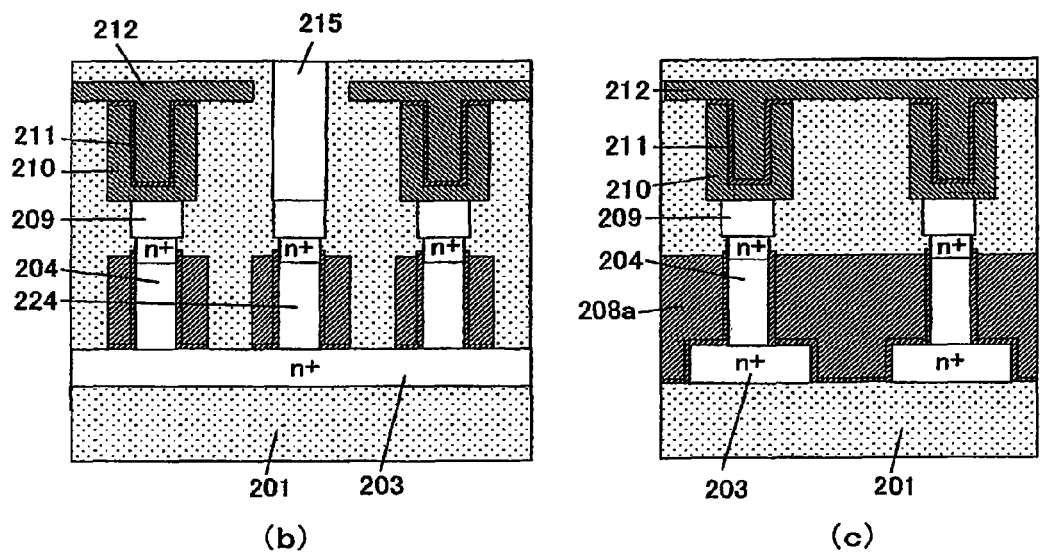
Figure 33:
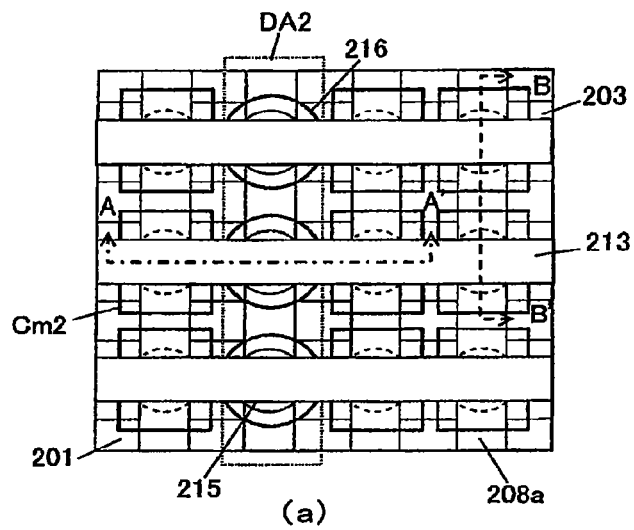
FIGS. 33(a) to 33(c) are process diagrams showing the production method for the SGT-DRAM according to the second embodiment, on a step-by-step basis.
Figure 33:
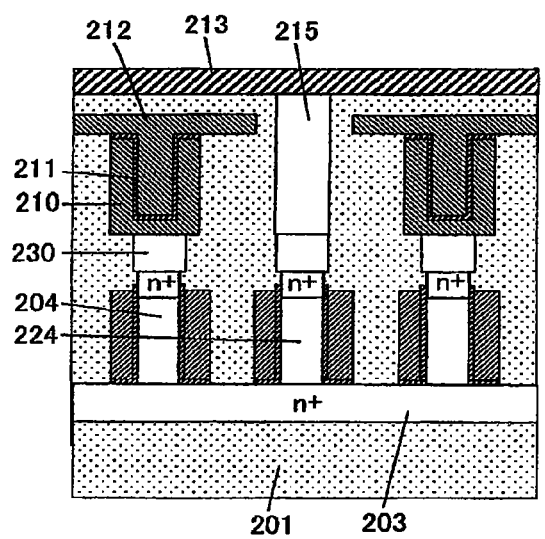
Figure 33:
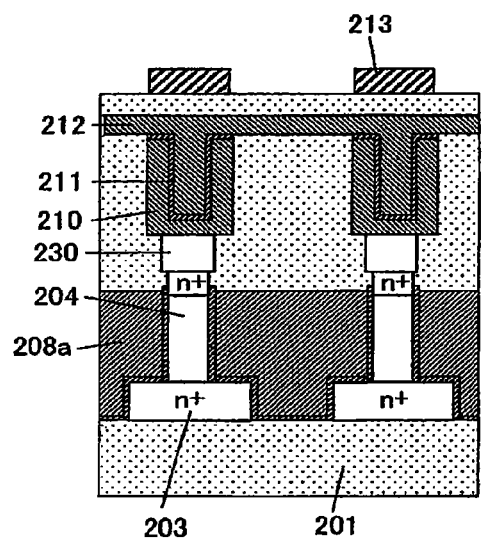

FIG. 25 is a top plan view showing the memory cell array in the second embodiment, wherein a regular memory cell section and a backing cell section DA2 are illustrated. FIG. 26 is a sectional view of the regular memory cell section and the backing cell section DA2, taken along the line A-A' in FIG. 25. FIG. 27 is a sectional view of the regular memory cell section, taken along the line B-B' in FIG. 25, and FIG. 28 is a sectional view of the backing cell section, taken along the line C-C' in FIG. 25.

With reference to FIGS. 25 and 26, a top plan structure of the memory cell array will be described below. A high-resistance bit line BLa2 comprised of a lower diffusion layer 203 is wired on a buried oxide film 201 in a row direction.

In the regular memory cell section, a selection transistor Qm2 is formed on the lower diffusion layer (first layer) 203 to allow access to a corresponding one of a plurality of regular memory cells. A gate dielectric film 207 and a gate electrode 208 are formed around a pillar-shaped silicon layer 204 constituting the selection transistor Qm2, and a regular word line WL2 comprised of a gate line 208a extending from the gate electrode of the selection transistor Qm2 is wired in a column direction. A first contact 209 is formed on a top of the pillar-shaped silicon layer 204 of the selection transistor Qm2, and connected to a capacitance element Cm2. In the backing cell section DA2, a backing transistor Qd2 is formed on the lower diffusion layer 203. A gate dielectric film 207 and a gate electrode 208 are formed around a pillar-shaped silicon layer 224 constituting the backing transistor Qd2, and a backing word line DWL2 comprised of a gate line 228a extending from the gate electrode of the backing transistor Qd2 is wired in the column direction. A first contact 209 is formed on a top of the pillar-shaped silicon layer 224 of the backing transistor Qd2, and connected to a second contact 215 formed in a contact hole 216 formed in an after-mentioned upper electrode 212 of the capacitance element Cm2. The second contact is connected to a low-resistance bit line 213 (BLb2) comprised of a first-layer interconnection line (second layer). As above, the high-resistance bit line BLa2 comprised of the $N^+$ diffusion layer 203 is backed with the low-resistance bit line BLb2 comprised of the first-layer interconnection line, through the backing transistor Qd2.

In the backing cell section, a structure and a layout configuration for a transistor are set to be exactly the same as those in the regular memory cell section, so that formation of the backing cell section causes no change in characteristics of the selection transistor in a part of the regular memory cells adjacent to the backing cell section. In the second embodiment, it is necessary to form the contact hole 216 in the upper electrode 212 of the capacitance element, so that characteristics of the capacitance element in a part of the regular memory cells adjacent to the backing cell section are likely to be adversely affected by irregularity in layout configuration of the capacitance element. However, a structure and a layout configuration of the capacitance element in a part of the regular memory cells adjacent to the backing cell section can be set to conform to those in the remaining regular memory cells by optimizing OPC (optical proximity correction) and/or adjusting etching conditions. In the second embodiment, the low-resistance bit line is comprised of the first-layer interconnection line 213. Thus, a need for forming a dedicated bit-line layer within a memory cell array as in the first embodiment can be eliminated to reduce the number of production steps.

With reference to FIGS. 26 to 28, a cross-section structure of the memory cell array will be described below.

A lower diffusion layer 203 serving as a high-resistance bit line BLa2 is formed on a buried oxide film 201.

In a regular memory cell section illustrated in FIGS. 26 and 27, a selection transistor Qm2 is formed on the lower diffusion layer 203 to allow access to a corresponding one of the regular memory cells. A gate dielectric film 207 and a gate electrode 208 are formed around a pillar-shaped silicon layer 204 constituting the selection transistor Qm2, and a gate line 208a is formed to extend from the gate electrode to serve as a regular word line WL2. An upper diffusion layer 205 is formed in an upper portion of the pillar-shaped silicon layer 204 of the selection transistor Qm2, and a first contact 209 is formed on the upper diffusion layer 205 and connected to a capacitance element Cm2. The capacitance element Cm2 comprises a lower electrode 210, a capacitance dielectric film 211, and an upper electrode 212.

In a backing cell section DA2 illustrated in FIGS. 26 and 28, a backing transistor Qd2 is formed on the lower diffusion layer 203. A gate dielectric film 207 and a gate electrode 208 are formed around a pillar-shaped silicon layer 224 constituting the backing transistor Qd2, and a gate line 228a is formed to extend from the gate electrode to serve as a backing word line DWL2. An upper diffusion layer 205 is formed in an upper portion of the pillar-shaped silicon layer 224 of the backing transistor Qd2, and a first contact 209 is formed on the upper diffusion layer 205. The first contact 209 is connected to a first interconnection layer 213 serving as a low-resistance bit line, through a contact hole 216 formed in the upper electrode 212 of the capacitance element.

With reference to FIGS. 29(a) to 33(c), one example of a production method for the SGT-DRAM according to the second embodiment will be described below. In this example, the steps before forming the first contact are the same as those in the first embodiment. Thus, the following description will be made about the steps after the step in FIGS. 20(a) to (c) in the first embodiment. In FIGS. 29(a) to 33(c), the figure suffixed with (a) is a top plan view of a memory cell array. Further, the figure suffixed with (b) is a sectional view of a regular memory cell section and a backing cell section in the memory cell array, taken along the line A-A' in the figure suffixed with (a), and the figure suffixed with (c) is a sectional view of the regular memory cell section in the memory cell array, taken along the line B-B' in the figure suffixed with (a).

As shown in FIGS. 29(a) to 29(c), a silicon oxide film serving as an interlayer film is formed, and then a first contact 209 is formed on a top of each of a selection-transistor pillar-shaped silicon layers 204 in a regular memory cell section, and backing-transistor pillar-shaped silicon layers 224 in a backing cell section.

As shown in FIGS. 30(a) to 30(c), a capacitance element Cm2 comprising a lower electrode 210, a dielectric film 211 and an upper electrode 212 is formed in the same manner as that in a conventional stacked DRAM. In regard to the backing-transistor pillar-shaped silicon layer 224, only the upper electrode 212 is formed just thereabove.

As shown in FIGS. 31(a) to 31(c), a contact hole 216 is formed in the upper electrode located just above the backing-transistor pillar-shaped silicon layer.

As shown in FIGS. 32(a) to 32(c), a second contact 215 is formed on the backing-transistor pillar-shaped silicon layer to penetrate through the contact hole 216 formed in the upper electrode.

As shown in FIGS. 33(a) to 33(c), a first interconnection layer 213 serving as a low-resistance line is formed on the second contact 215.

Third Embodiment

A third embodiment of the present invention shows an SGT-DRAM structure in which a high-resistance bit line is backed with a low-resistance bit line through a pillar-shaped silicon layer comprised of a high-concentration $N^+$ diffusion layer, instead of a backing transistor.

In the third embodiment, a high-resistance bit line is backed with a low-resistance bit line through a pillar-shaped silicon layer where a gate electrode and a gate dielectric film therearound are removed by etching, and an impurity is doped therein in a high concentration. Thus, a high-resistance bit line can be connected to a low-resistance bit line through a lower resistance than that in the first and second embodiments using a transistor.

Figure 34:
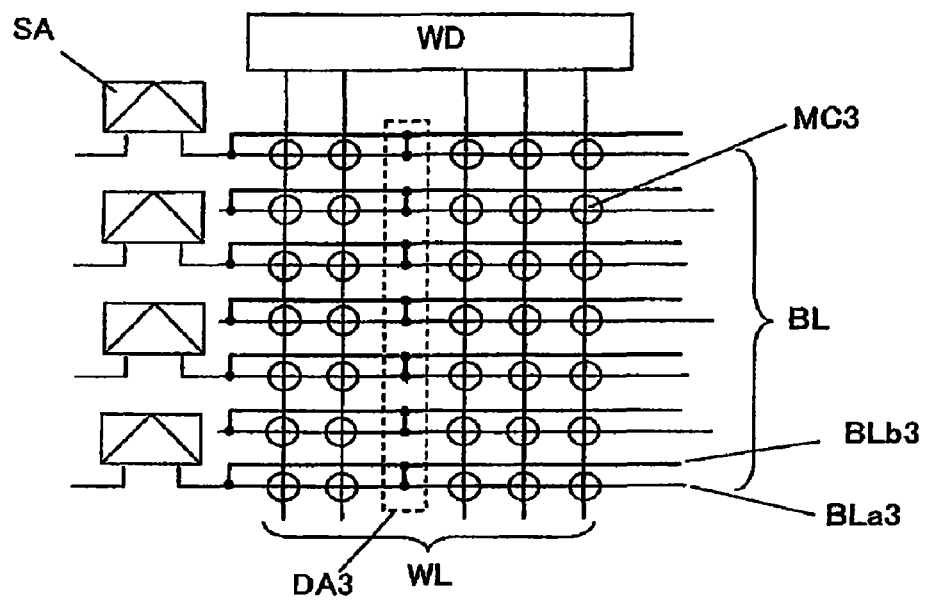
FIG. 34 is a diagram showing an equivalent circuit of a memory cell array and a peripheral circuit in an SGT-DRAM according to a third embodiment of the present invention.

FIG. 34 shows an equivalent circuit of a memory cell array and a part of peripheral circuits in an SGT-DRAM according to the third embodiment. As seen in this equivalent circuit, a plurality of high-resistance bit lines BLa3 each comprised of an $N^+$ diffusion layer are backed with respective ones of a plurality of low-resistance bit lines BLb3, to provide substantially low-resistance bit lines. Each of the bit lines is backed with a corresponding one of a plurality of backing cells formed in a backing cell section DA3 within the memory cell array.

Figure 35:
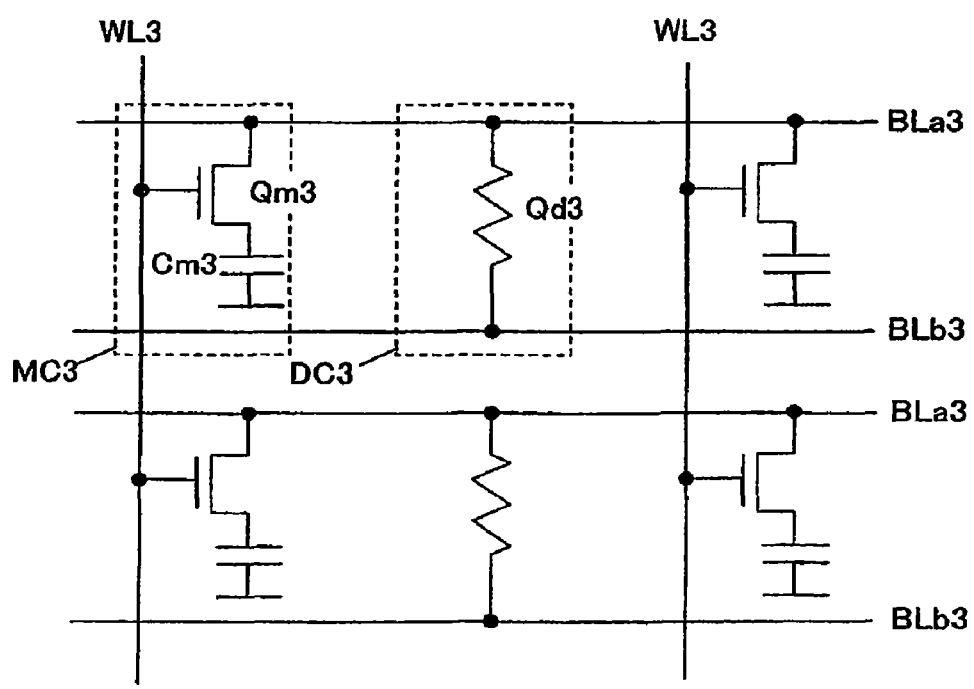
FIG. 35 is a diagram showing an equivalent circuit of a memory cell in the SGT-DRAM according to the third embodiment.

FIG. 35 shows an equivalent circuit of a regular memory cell MC3 and a backing cell DC3 in the third embodiment. The regular memory cell MC3 comprises a single capacitance element Cm3 for accumulating electric charges therein, and a single selection transistor Qm3 for transferring electric charges. Respective operations of the capacitance element Cm3 and the selection transistor Qm3 are the same as those of the capacitance element Cm and the selection transistor Qm in FIG. 2. The backing cell DC3 comprises a high-concentration impurity-doped pillar-shaped silicon layer Qd3 for connecting one of the high-resistance bit lines BLa3 comprised of an $N^+$ diffusion layer, and a corresponding one of the low-resistance bit lines BLb3. Differently from the first and second embodiments, the third embodiment has no need to provide the word line for the backing transistor, so that a circuit configuration can be simplified.

Figure 36:
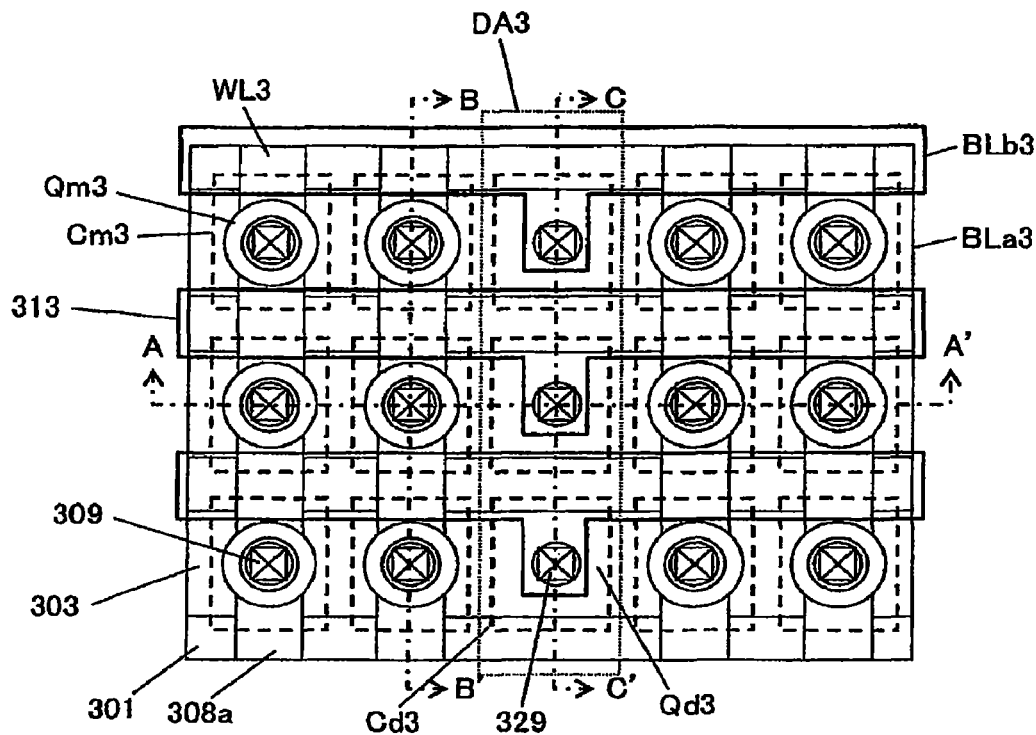
FIG. 36 is a top plan view showing the memory cell array in the SGT-DRAM according to the third embodiment.
Figure 37:
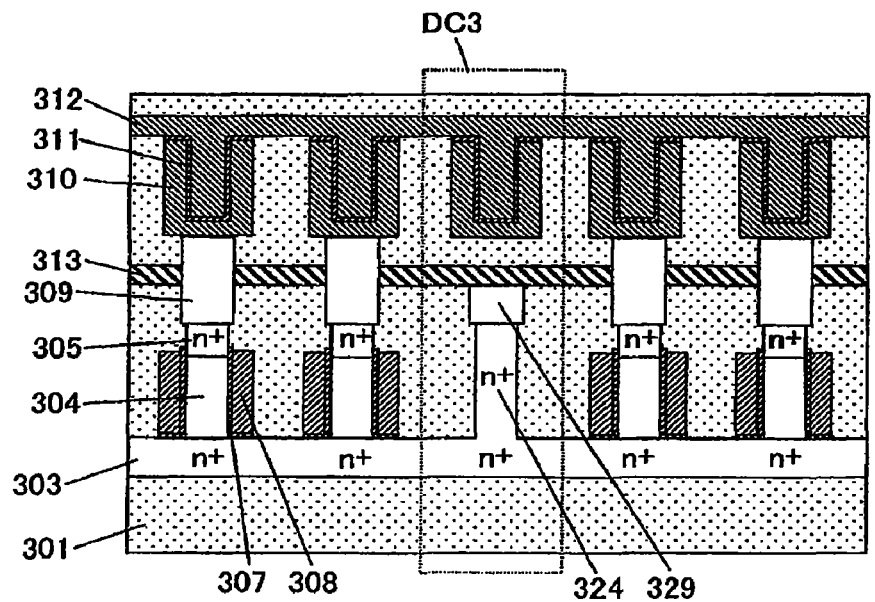
FIG. 37 is a sectional view showing the memory cell array in the SGT-DRAM according to the third embodiment.
Figure 38:
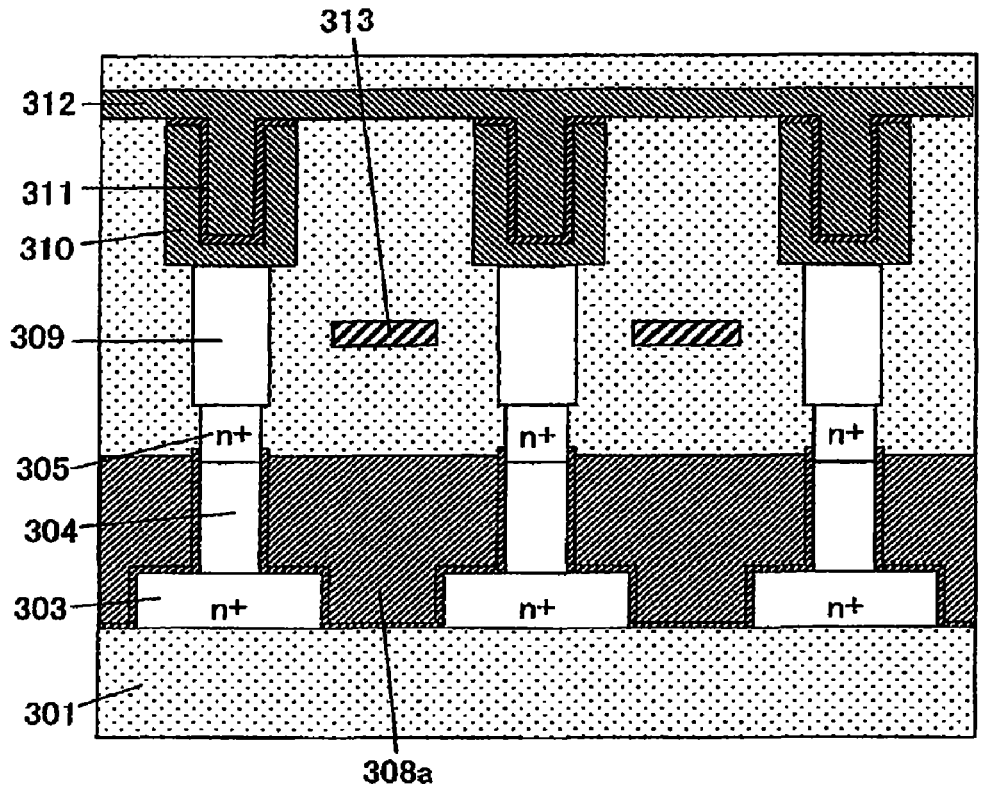
FIG. 38 is a sectional view showing the memory cell array in the SGT-DRAM according to the third embodiment.
Figure 39:
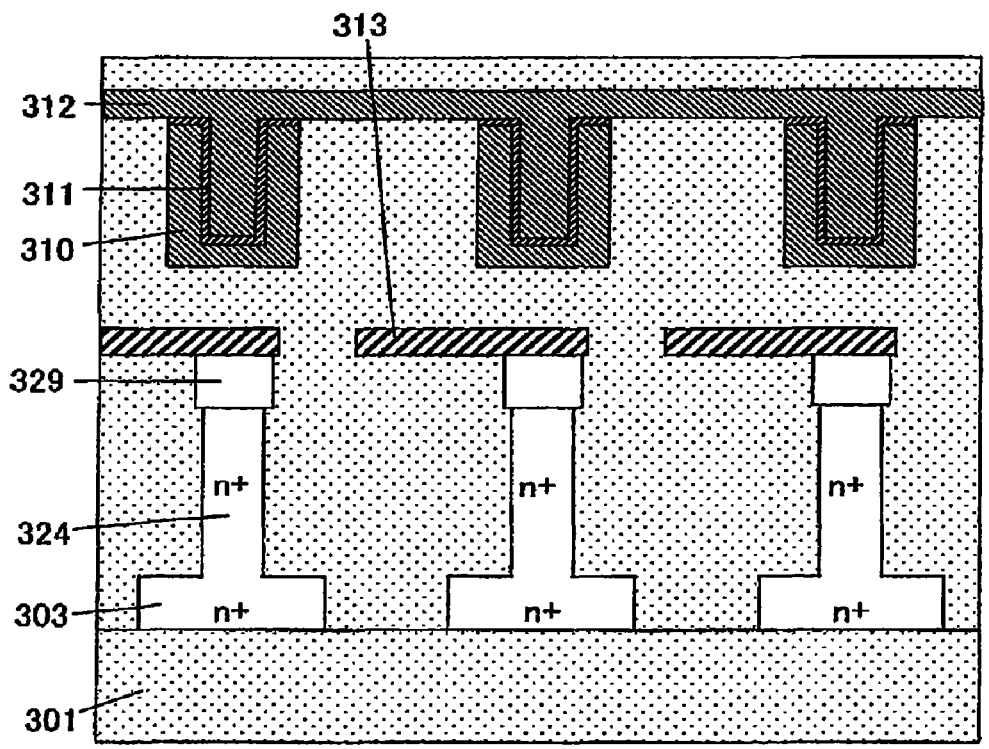
FIG. 39 is a sectional view showing the memory cell array in the SGT-DRAM according to the third embodiment.
Figure 40:
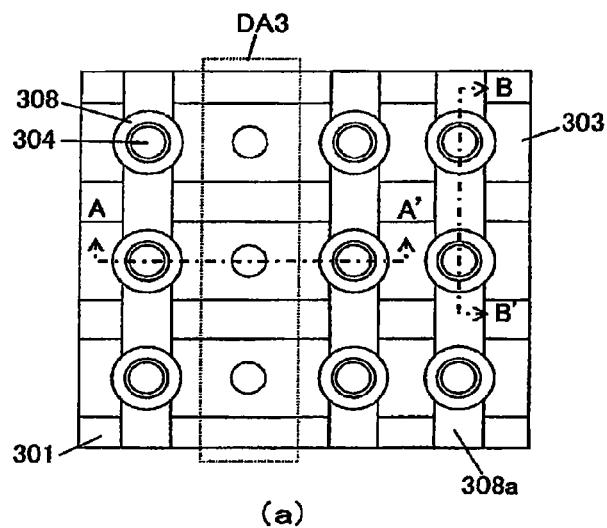
FIGS. 40(a) to 40(c) are process diagrams showing a production method for the SGT-DRAM according to the third embodiment, on a step-by-step basis.
Figure 40:
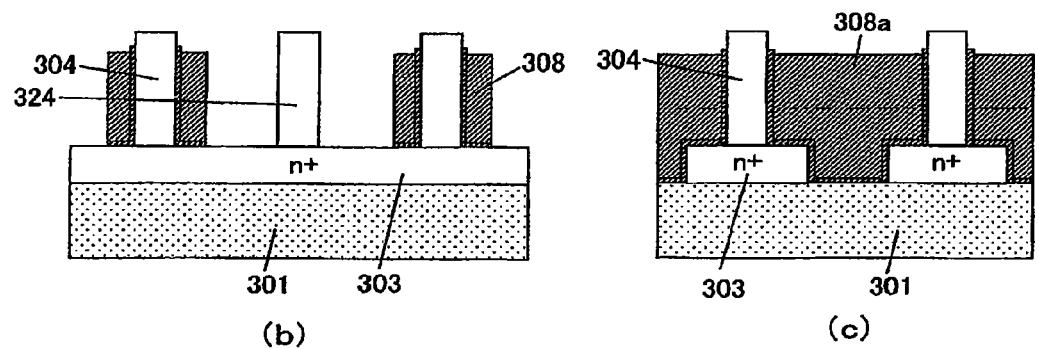
Figure 41:
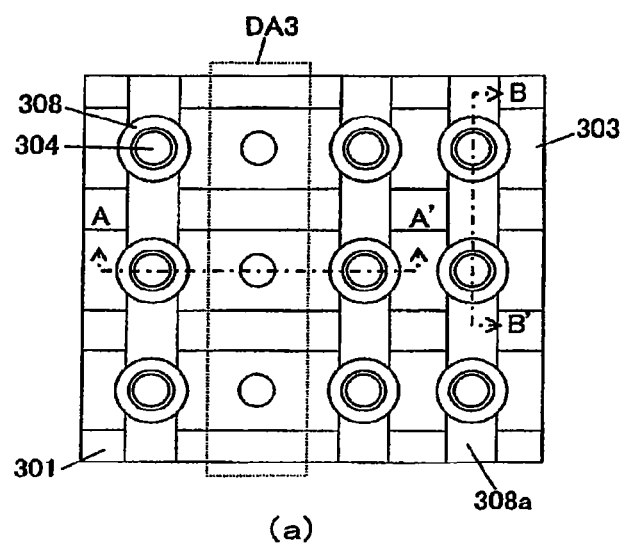
FIGS. 41(a) to 41(c) are process diagrams showing the production method for the SGT-DRAM according to the third embodiment, on a step-by-step basis.
Figure 41:
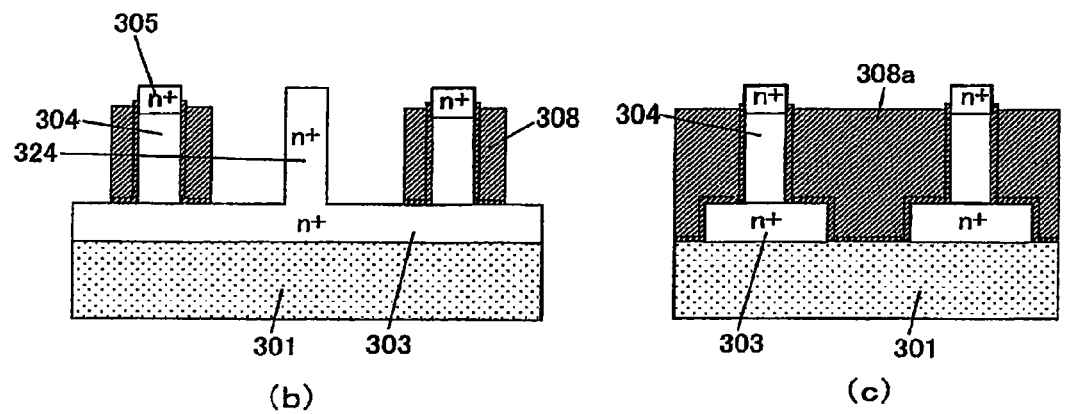

FIG. 36 is a top plan view showing the memory cell array in the third embodiment, wherein a regular memory cell section and a backing cell section DA3 are illustrated. FIG. 37 is a sectional view of the regular memory cell section and the backing cell section, taken along the line A-A' in FIG. 36. FIG. 38 is a sectional view of the regular memory cell section, taken along the line B-B' in FIG. 36, and FIG. 39 is a sectional view of the backing cell section, taken along the line C-C' in FIG. 36.

With reference to FIGS. 36 and 37, a top plan structure of the memory cell array will be described below. A high-resistance bit line BLa3 comprised of a lower diffusion layer 303 is wired on a buried oxide film 301 in a row direction.

In the regular memory cell section, a selection transistor Qm3 is formed on the lower diffusion layer 303 to allow access to a corresponding one of a plurality of regular memory cells. A gate dielectric film 307 and a gate electrode 308 are formed around a pillar-shaped silicon layer 304 constituting the selection transistor Qm3, and a word line WL3 comprised of a gate line 308a extending from the gate electrode of the selection transistor Qm3 is wired in a column direction. A capacitance contact 309 is formed on a top of the pillar-shaped silicon layer 304 of the selection transistor Qm3, and connected to a capacitance element Cm3.

In the backing cell section DA3, a backing pillar-shaped silicon layer Qd3 is formed on the lower diffusion layer 303. A gate dielectric film and a gate electrode each formed around the backing pillar-shaped silicon layer Qd3 are removed by etching, and the backing pillar-shaped silicon layer Qd3 is entirely doped with a high-concentration $N^+$ impurity. A bit-line contact 329 is formed on a top of the backing pillar-shaped silicon layer Qd3, and connected to a low-resistance bit line 313 (BLb3) comprised of a metal film. As above, the high-resistance bit line BLa3 comprised of the $N^+$ diffusion layer 303 is backed with the low-resistance bit line BLb3 through the backing pillar-shaped silicon layer Qd3. Thus, a resistance of the interconnection section for backing can be lowered as compared with the interconnection using a transistor as in the first and second embodiments.

In the backing cell section, a structure and a layout configuration for a pillar-shaped silicon layer and a capacitance element are set to be exactly the same as those in the regular memory cell section, so that formation of the backing cell section causes no change in characteristics of the selection transistor or the capacitance element in a part of the regular memory cells adjacent to the backing cell section.

With reference to FIGS. 37 to 39, a cross-section structure of the memory cell array will be described below.

A lower diffusion layer 303 serving as a high-resistance bit line BLa3 is formed on a buried oxide film 301.

In a regular memory cell section illustrated in FIGS. 37 and 38, a selection transistor Qm3 is formed on the lower diffusion layer (first layer) 303 to allow access to a corresponding one of the regular memory cells. A gate dielectric film 307 and a gate electrode 308 are formed around a pillar-shaped silicon layer 304 constituting the selection transistor Qm3, and a gate line 308a is formed to extend from the gate electrode to serve as a word line WL3. An upper diffusion layer 305 is formed in an upper portion of the pillar-shaped silicon layer 304 of the selection transistor Qm3, and a capacitance contact 309 is formed on the upper diffusion layer 305 and connected to a capacitance element Cm3. The capacitance element Cm3 comprises a lower electrode 310, a capacitance dielectric film 311, and an upper electrode 312.

In a backing cell section DA3 illustrated in FIGS. 37 and 39, a backing pillar-shaped silicon layer Qd3 is formed on the lower diffusion layer 303. A gate dielectric film and a gate electrode each formed around the backing pillar-shaped silicon layer Qd3 are removed by etching, and the backing pillar-shaped silicon layer Qd3 is entirely doped with a high-concentration $N^+$ impurity. A bit contact 329 is formed on a top of the pillar-shaped silicon layer 324, and connected to a low-resistance bit line 313 (BLb3) comprised of a metal film (second layer). A dummy capacitance element Cd3 is formed just above the low-resistance bit line to maintain layout regularity of the capacitance elements.

With reference to FIGS. 40(a) to 41(c), one example of a production method for the SGT-DRAM according to the third embodiment will be described below. In this example, the steps before forming the gate electrode and the gate line are the same as those in the first embodiment. Thus, the following description will be made about the steps after the step in FIGS. 18(a) to (c) in the first embodiment. In FIGS. 40(a) to 41(c), the figure suffixed with (a) is a top plan view of a memory cell array. Further, the figure suffixed with (b) is a sectional view of a regular memory cell section and a backing cell section in the memory cell array, taken along the line A-A' in the figure suffixed with (a), and the figure suffixed with (c) is a sectional view of the regular memory cell section in the memory cell array, taken along the line B-B' in the figure suffixed with (a).

As shown in FIGS. 40(a) to 40(c), after forming the gate conductive film and the gate dielectric film, only a backing pillar-shaped silicide portion is covered by a resist, and then the gate conductive film and the gate dielectric film each formed on the backing pillar-shaped silicon layer 324 are removed by dry etching.

As shown in FIGS. 41(a) to 41(c), an impurity, such as P or As, is introduced into an upper portion of a pillar-shaped silicon layer in a regular memory cell section by ion implantation or the like, to form an $N^+$ lower diffusion layer 305 in the upper portion of the pillar-shaped silicon layer. In regard to the backing pillar-shaped silicon layer 324, an $N^+$ impurity is additionally imprinted to allow the backing pillar-shaped silicon layer 324 to be entirely doped with the impurity in a high concentration, according to need.

The subsequent steps are the same as those in the first embodiment.

As above, in the third embodiment, a structure and a layout configuration for a pillar-shaped silicon layer and a capacitance element in the backing cell section are exactly the same as those in the regular memory cell section, as with the first embodiment. Thus, characteristics of a part of the regular memory cells adjacent to the backing cell section are never adversely affected by formation of the backing cell section, so that the high-resistance bit line can be backed with the low-resistance bit line to provide a substantially low-resistance bit line, without an increase in unnecessary area within the memory cell array.

Further, in the third embodiment, the high-resistance bit line 303 is connected to the low-resistance bit line 313 through the pillar-shaped silicon layer comprised of a high-concentration N+ diffusion layer. Thus, the high-resistance bit line can be backed with the low-resistance bit line through a lower resistance than that in the first and second embodiments.

In addition, the third embodiment can eliminate the need for continuously applying a certain voltage to the backing word line (DWL1, DWL2) as in the first and second embodiments. Thus, a peripheral circuit configuration can be simplified.

Preferably, in the third embodiment, a cell located at an outermost position of the memory cell array is used as a backing cell. The outermost cell has been generally not used as a memory cell, because it has characteristic different from other cells located inside the memory cell array due to irregularity in layout. The technique of using the outermost cell as a backing cell makes it possible to facilitate effective utilization of the outermost cell which has otherwise been arranged as a dummy pattern constituting a factor causing an increase in chip area.

Fourth Embodiment

A fourth embodiment of the present invention shows an SGT-DRAM structure in which a high-resistance bit line is backed with a low-resistance bit line through a contact.

In the fourth embodiment, no pillar-shaped silicon layer is formed in a backing cell section. Thus, characteristics of a part of a plurality of regular memory cells adjacent to the backing cell section are likely to become different from those in the remaining regular memory cells. However, if such a difference in characteristics can be suppressed by layout correction based on OPC and/or optimization of etching conditions, a high-resistance bit line can be backed with a low-resistance bit line in a significantly simple manner and through a lower resistance. An equivalent circuit of the SGT-DRAM according to the fourth embodiment is the same as that of the SGT-DRAM according to the third embodiment.

Figure 42:
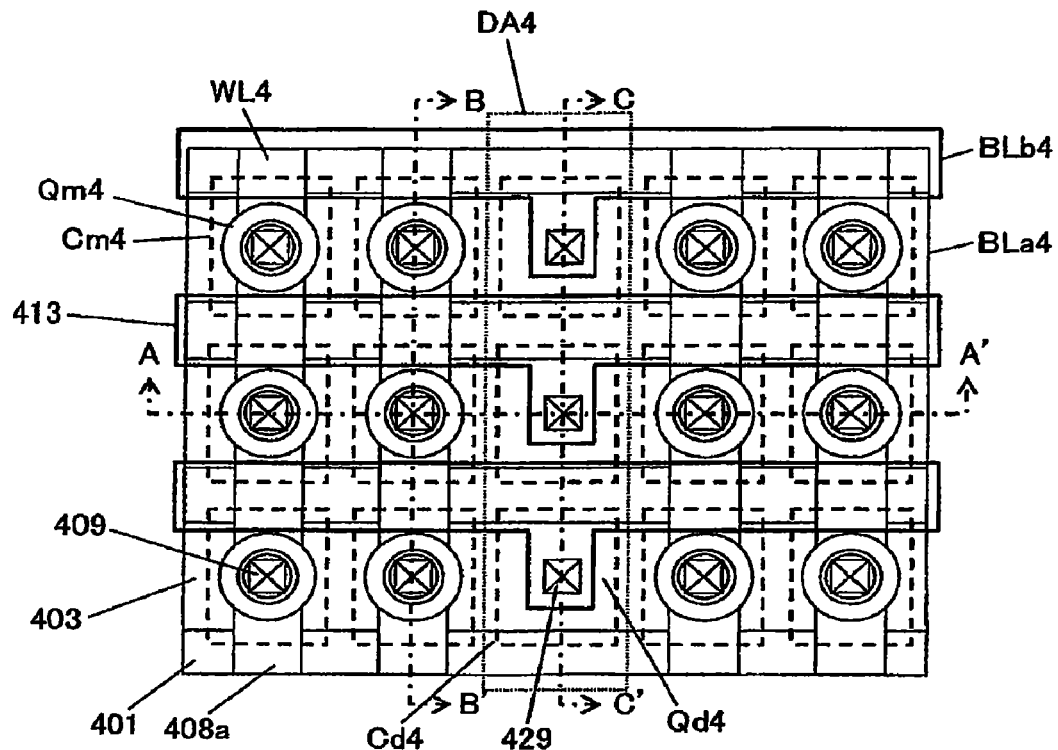
FIG. 42 is a top plan view showing a memory cell array in an SGT-DRAM according to a fourth embodiment of the present invention.
Figure 43:
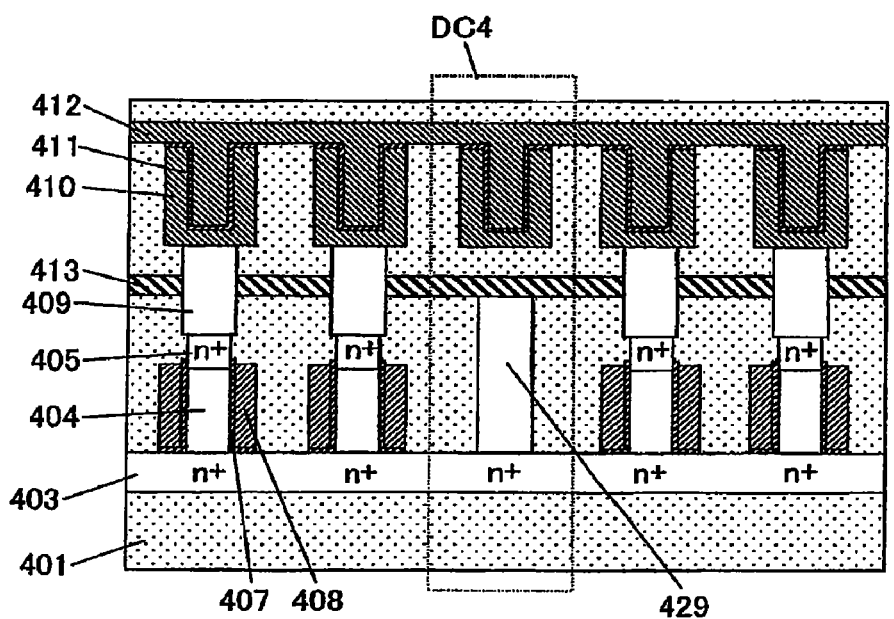
FIG. 43 is a sectional view showing the memory cell array in the SGT-DRAM according to the fourth embodiment.
Figure 44:
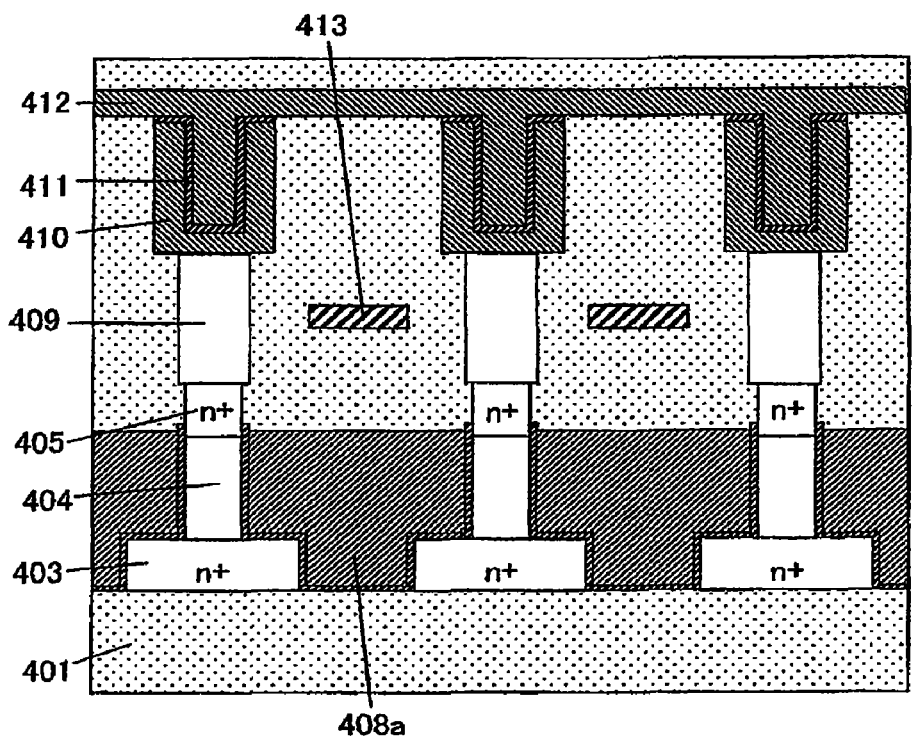
FIG. 44 is a sectional view showing the memory cell array in the SGT-DRAM according to the fourth embodiment.
Figure 45:
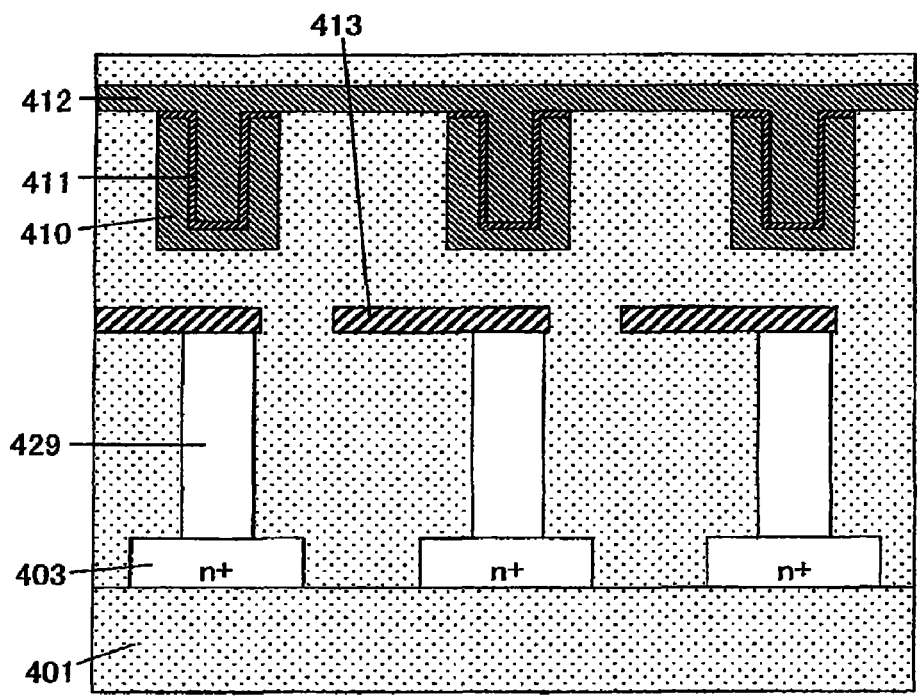
FIG. 45 is a sectional view showing the memory cell array in the SGT-DRAM according to the fourth embodiment.

FIG. 42 is a top plan view showing a memory cell array in the fourth embodiment, wherein a regular memory cell section and a backing cell section DA4 are illustrated. FIG. 43 is a sectional view of the regular memory cell section and the backing cell section, taken along the line A-A' in FIG. 42. FIG. 44 is a sectional view of the regular memory cell section, taken along the line B-B' in FIG. 42, and FIG. 45 is a sectional view of the backing cell section, taken along the line C-C' in FIG. 42.

With reference to FIGS. 42 and 43, a top plan structure of the memory cell array will be described below. A high-resistance bit line BLa4 comprised of a lower diffusion layer 403 is wired on a buried oxide film 401 in a row direction.

In the regular memory cell section, a selection transistor Qm4 is formed on the lower diffusion layer 403 to allow access to a corresponding one of a plurality of regular memory cells. A gate dielectric film 407 and a gate electrode 408 are formed around a pillar-shaped silicon layer 404 constituting the selection transistor Qm4, and a word line WL4 comprised of a gate line 408a extending from the gate electrode of the selection transistor Qm4 is wired in a column direction. A capacitance contact 409 is formed on a top of the pillar-shaped silicon layer 404 of the selection transistor Qm4, and connected to a capacitance element Cm4.

In the backing cell section DA4, a bit-line contact 429 is directly connected to the lower diffusion layer 403 without forming a backing pillar-shaped silicon layer on the lower diffusion layer 403, so that the lower diffusion layer 403 is connected to a low-resistance bit line 413 (BLb4) comprised of a metal film, through the bit-line contact 429. As above, the interconnection section for backing is formed by the bit-line contact 429 comprised of a metal film, such as a tungsten film. Thus, a resistance of the backing interconnection can be lowered.

In the fourth embodiment, a layout configuration for the pillar-shaped silicon layer becomes irregular in the backing cell section, which is likely to adversely affect characteristics of the selection transistor in a part of the regular memory cells adjacent to the backing cell section. However, if a difference in characteristics can be suppressed by layout correction based on OPC and/or optimization of etching conditions, a high-resistance bit line can be backed with a low-resistance bit line in a significantly simple manner and through a lower resistance.

With reference to FIGS. 43 to 45, a cross-section structure of the memory cell array will be described below.

A lower diffusion layer (first layer) 403 serving as a high-resistance bit line BLa4 is formed on a buried oxide film 401.

In a regular memory cell section illustrated in FIGS. 43 and 44, a selection transistor Qm4 is formed on the lower diffusion layer 403 to allow access to a corresponding one of the regular memory cells. A gate dielectric film 407 and a gate electrode 408 are formed around a pillar-shaped silicon layer 404 constituting the selection transistor Qm4, and a gate line 408a is formed to extend from the gate electrode to serve as a word line WL4. An upper diffusion layer 405 is formed in an upper portion of the pillar-shaped silicon layer 404 of the selection transistor Qm4, and a capacitance contact 409 is formed on the upper diffusion layer 405 and connected to a capacitance element Cm4. The capacitance element Cm4 comprises a lower electrode 410, a capacitance dielectric film 411, and an upper electrode 412.

In a backing cell section DA4 illustrated in FIGS. 43 and 45, a bit-line contact 429 is directly formed on the lower diffusion layer 403, and connected to a low-resistance bit line 413 (BLb4) comprised of a metal film (second layer). A dummy capacitance element Cd4 is formed just above the low-resistance bit line 413 to maintain layout regularity of the capacitance elements.

A production method for the SGT-DRAM according to the fourth embodiment is the same as that in the first embodiment.

As above, in the fourth embodiment, the high-resistance bit line 403 is backed with the low-resistance bit line 413 through the bit-line contact. Thus, the high-resistance bit line can be backed with the low-resistance bit line through a significantly low resistance. In addition, the fourth embodiment can eliminate the need for continuously applying a certain voltage to the backing word line (DWL1, DWL2) as in the first and second embodiments. Thus, a peripheral circuit configuration can be simplified.

In cases where a difference in characteristics of the selection transistor between a part of the regular memory cells adjacent to the backing cell section and the remaining regular memory cells cannot be suppressed only by layout correction based on OPC and optimization of etching conditions, each of the adjacent regular memory cells may be formed as an actually nonfunctional dummy cell, for example, by removing a capacitance contact thereof.

Fifth Embodiment

A fifth embodiment of the present invention shows an SGT-DRAM structure in which a high-resistance bit line is backed with a low-resistance bit line through a contact as with the fourth embodiment.

In the fourth embodiment, characteristics of the selection transistor in a part of the regular memory cells adjacent to the backing cell section are likely to become different from those in the remaining regular memory cells, because regularity of the pillar-shaped silicon layers in the backing cell section is not maintained. In the fifth embodiment, a high-resistance bit line can be backed with a low-resistance bit line while maintaining regularity of pillar-shaped silicon layers, so that a backing wiring can be formed without adversely affecting characteristics of the selection transistor.

An equivalent circuit of the SGT-DRAM according to the fifth embodiment is the same as that of the SGT-DRAM according to the fourth embodiment.

Figure 46:
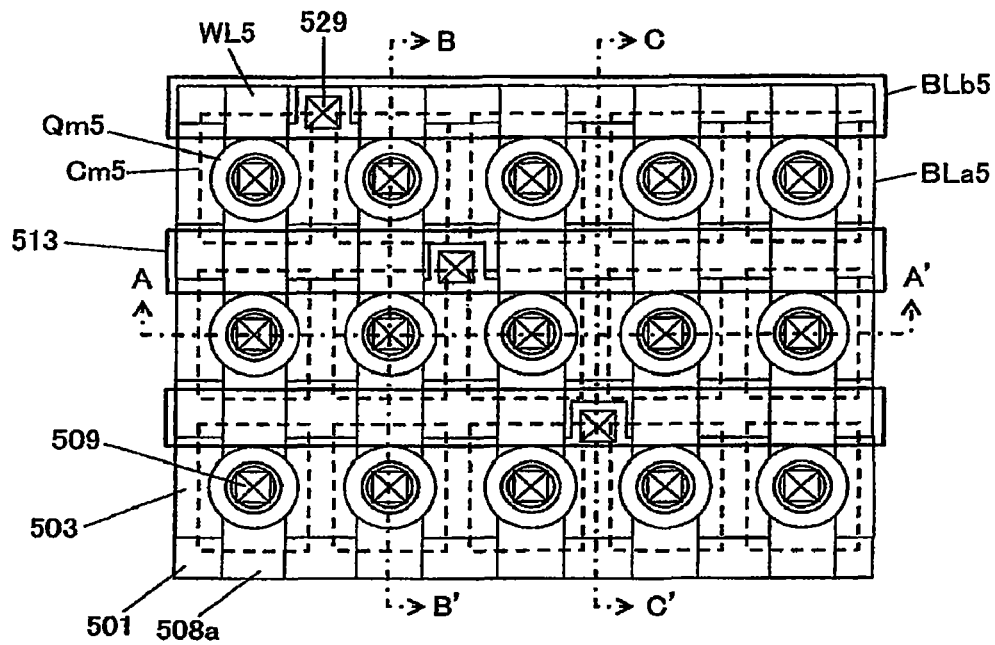
FIG. 46 is a top plan view showing a memory cell array in an SGT-DRAM according to a fifth embodiment of the present invention.
Figure 47:
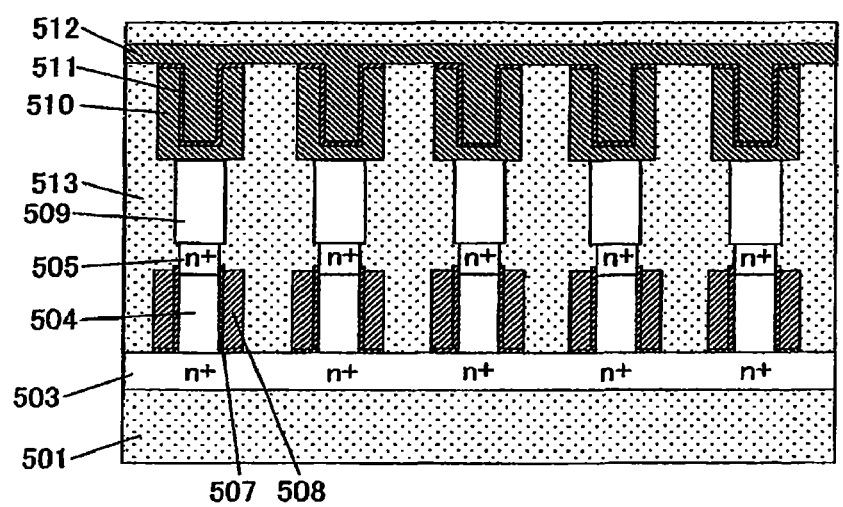
FIG. 47 is a sectional view showing the memory cell array in the SGT-DRAM according to the fifth embodiment.
Figure 48:
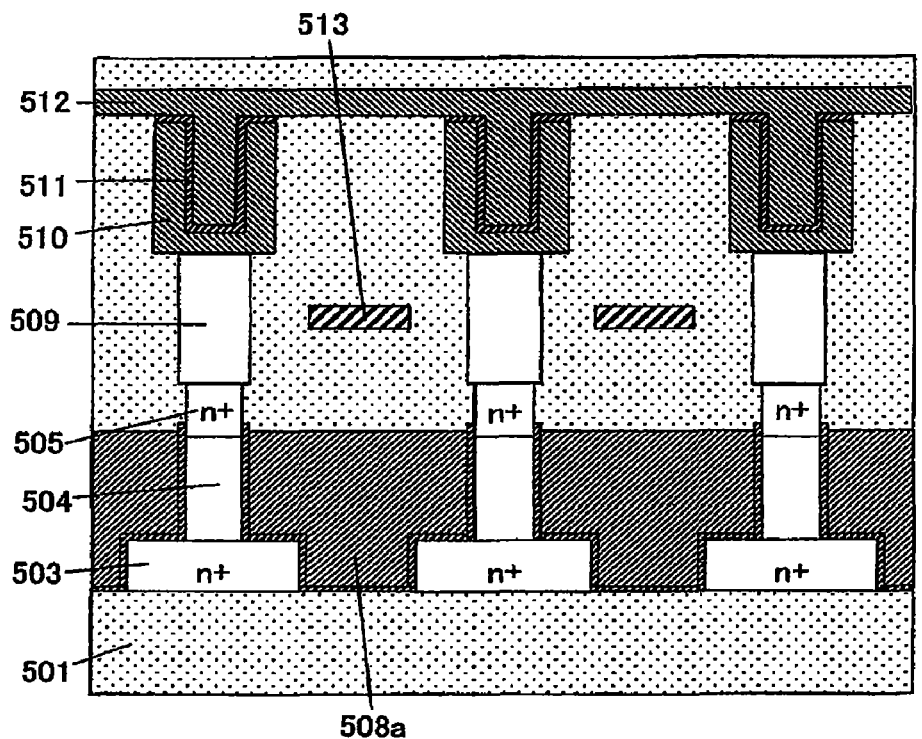
FIG. 48 is a sectional view showing the memory cell array in the SGT-DRAM according to the fifth embodiment.
Figure 49:
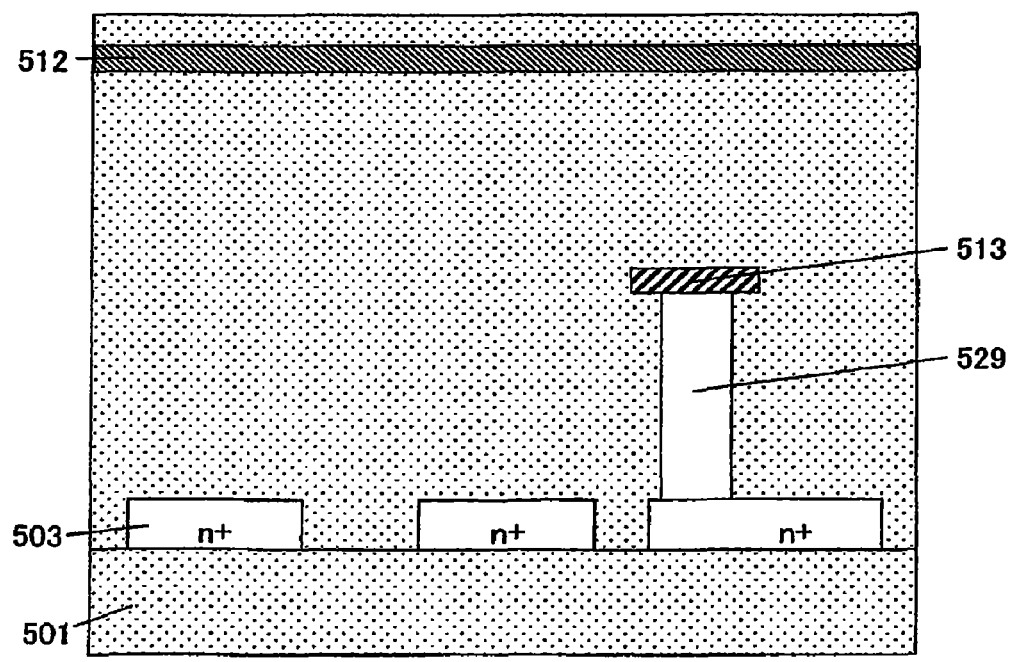
FIG. 49 is a sectional view showing the memory cell array in the SGT-DRAM according to the fifth embodiment.

FIG. 46 is a top plan view showing a memory cell array in the fifth embodiment. FIG. 47 is a sectional view taken along the line A-A' in FIG. 46. FIG. 48 is a sectional view taken along the line B-B' in FIG. 46, and FIG. 49 is a sectional view taken along the line C-C' in FIG. 46.

With reference to FIGS. 46 and 47, a top plan structure of the memory cell array will be described below. A high-resistance bit line BLa5 comprised of a lower diffusion layer 503 is wired on a buried oxide film 501 in a row direction.

A selection transistor Qm5 is formed on the lower diffusion layer 503 to allow access to a corresponding one of a plurality of regular memory cells. A gate dielectric film 507 and a gate electrode 508 are formed around a pillar-shaped silicon layer 504 constituting the selection transistor Qm5, and a word line WL5 comprised of a gate line 508a extending from the gate electrode of the selection transistor Qm5 is wired in a column direction. A capacitance contact 509 is formed on a top of the pillar-shaped silicon layer 504 of the selection transistor Qm5, and connected to a capacitance element Cm5.

In the fifth embodiment, an interconnection for backing is performed by a bit-line contact 529 formed on the lower diffusion layer. Further, the bit-line contact 529 is formed between adjacent ones of the pillar-shaped silicon layers to avoid adversely affecting an arrangement of the pillar-shaped silicon layers. The bit-line contact 529 is formed on the lower diffusion layer 503, and the lower diffusion layer 503 is connected to a low-resistance bit line 513 (BLb5) comprised of a metal film, through the bit-line contact 429. The bit-line contact 529 is comprised of a metal film, such as a tungsten film. Thus, the high-resistance bit line can be backed with the low-resistance bit line through a low resistance.

With reference to FIGS. 47 to 49, a cross-section structure of the memory cell array will be described below.

A lower diffusion layer 503 serving as a high-resistance bit line BLa5 is formed on a buried oxide film 501.

In a regular memory cell section illustrated in FIGS. 47 and 48, a selection transistor Qm5 is formed on the lower diffusion layer (first layer) 503 to allow access to a corresponding one of the regular memory cells. A gate dielectric film 507 and a gate electrode 508 are formed around a pillar-shaped silicon layer 504 constituting the selection transistor Qm5, and a gate line 508a is formed to extend from the gate electrode to serve as a word line WL5. An upper diffusion layer 505 is formed in an upper portion of the pillar-shaped silicon layer 504 of the selection transistor Qm5, and a capacitance contact 509 is formed on the upper diffusion layer 505 and connected to a capacitance element Cm5. The capacitance element Cm5 comprises a lower electrode 510, a capacitance dielectric film 511, and an upper electrode 512.

In a backing cell section DA5 illustrated in FIG. 49, a bit-line contact 529 is directly formed on the lower diffusion layer 503, and connected to a low-resistance bit line 513 (BLb5) comprised of a metal film (second layer). A production method for the SGT-DRAM according to the fifth embodiment is the same as that in the first embodiment.

As above, in the fifth embodiment, the high-resistance bit line 503 is backed with the low-resistance bit line 513 through the low-resistance bit-line contact. Thus, the high-resistance bit line can be backed with the low-resistance bit line through a significantly low resistance. In addition, the fifth embodiment can eliminate the need for continuously applying a certain voltage to the backing word line as in the first and second embodiments. Thus, a peripheral circuit configuration can be simplified.

Further, the backing bit-line contact can be formed without changing an arrangement of the pillar-shaped silicon layers and the capacitance elements. Thus, the interconnection for backing can be formed without adversely affecting characteristics of the selection transistor and the capacitance element.

Sixth Embodiment

A sixth embodiment of the present invention shows a structure and a production method for an SGT-SRAM in cases where the present invention is implemented using a bulk silicon substrate. Although the following description will be made based on one example where the SGT-SRAM according to the first embodiment is produced using a bulk silicon substrate, it is understood that the SGT-SRAM according to each of the second to fifth embodiments can also be produced using a bulk silicon substrate.

Figure 50:
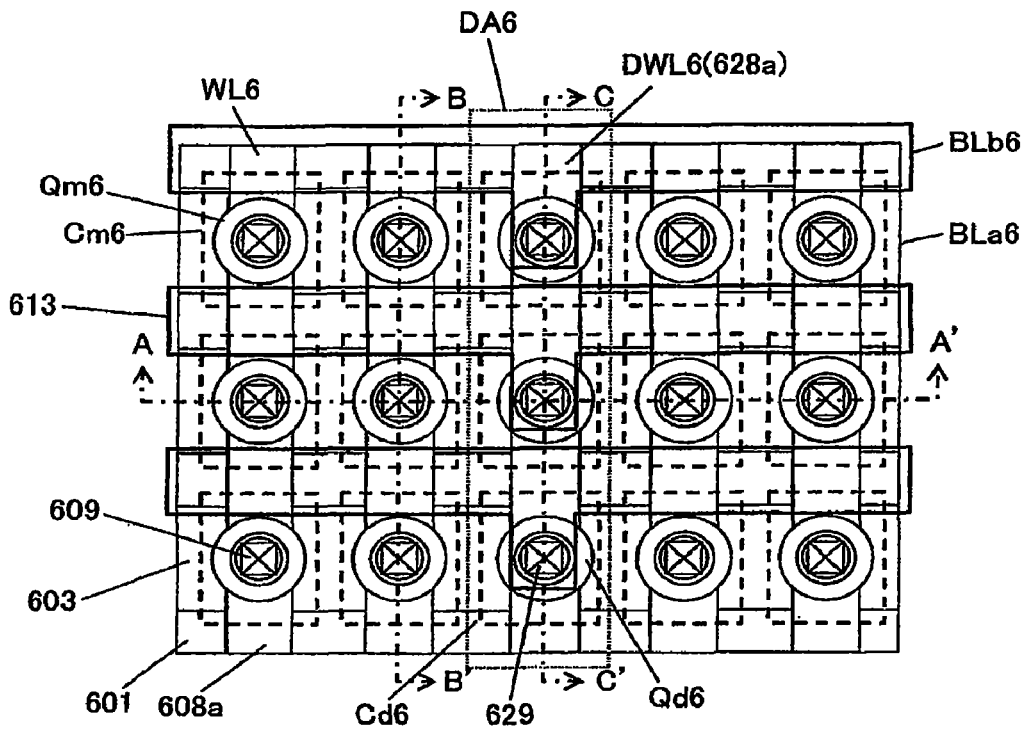
FIG. 50 is a top plan view showing a memory cell array in an SGT-DRAM according to a sixth embodiment of the present invention.
Figure 51:
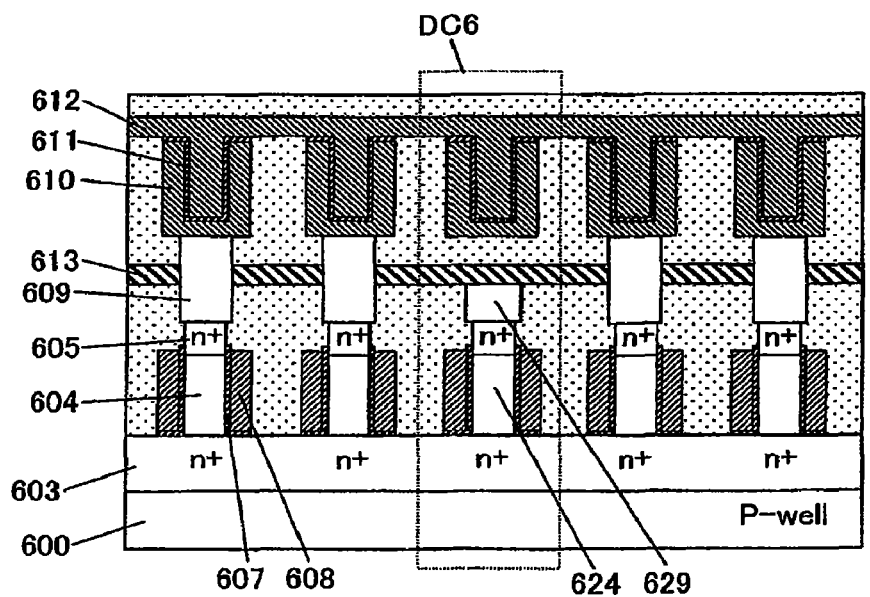
FIG. 51 is a sectional view showing the memory cell array in the SGT-DRAM according to the sixth embodiment.
Figure 52:
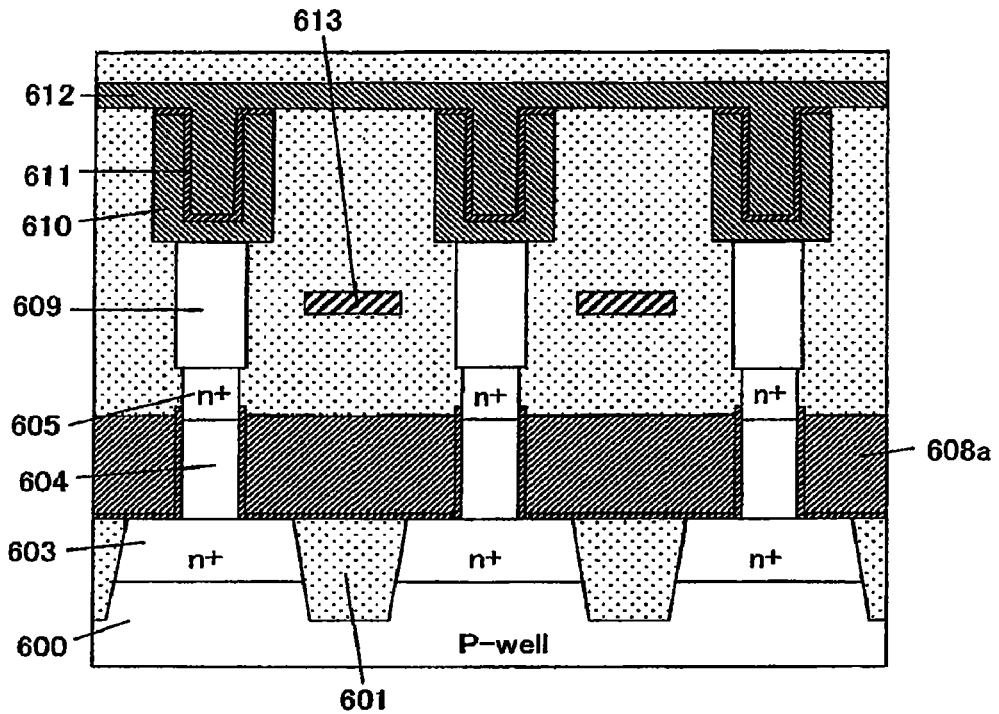
FIG. 52 is a sectional view showing the memory cell array in the SGT-DRAM according to the sixth embodiment.
Figure 53:
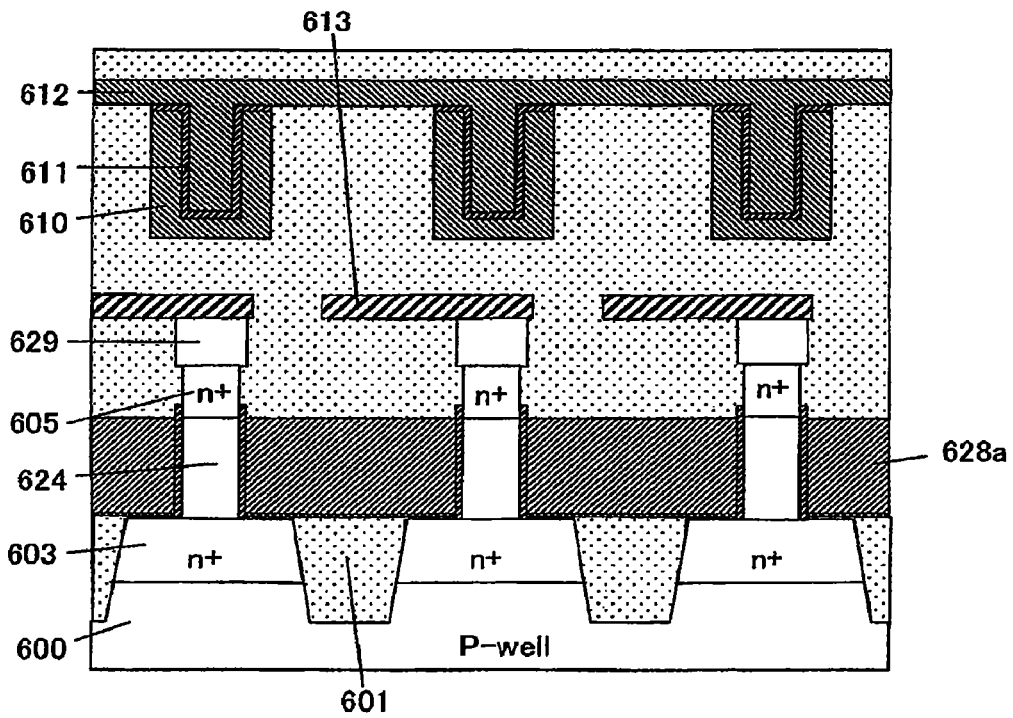
FIG. 53 is a sectional view showing the memory cell array in the SGT-DRAM according to the sixth embodiment.
Figure 54:
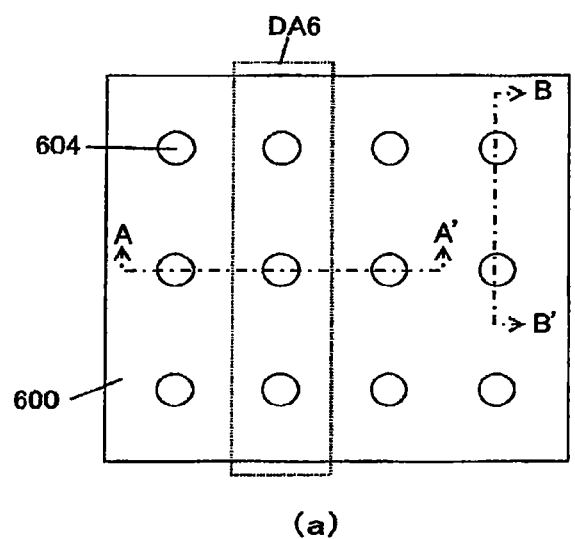
FIGS. 54(a) to 54(c) are process diagrams showing a production method for the SGT-DRAM according to the sixth embodiment, on a step-by-step basis.
Figure 54:
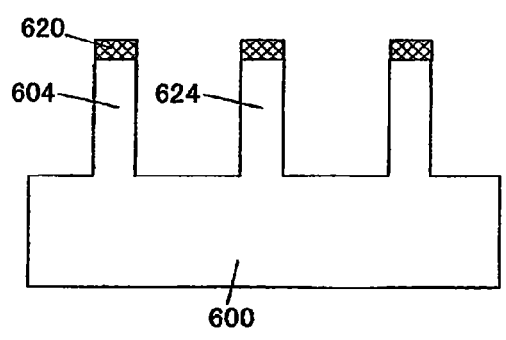
Figure 54:
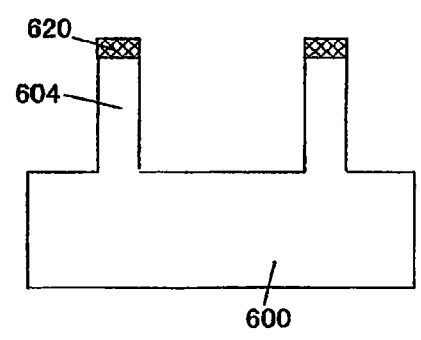
Figure 55:
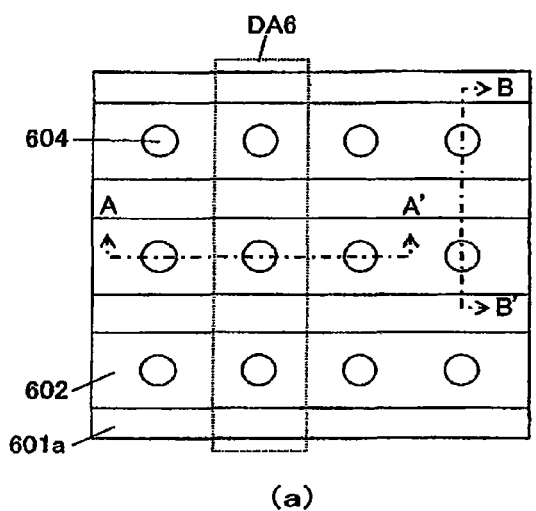
FIGS. 55(a) to 55(c) are process diagrams showing the production method for the SGT-DRAM according to the sixth embodiment, on a step-by-step basis.
Figure 55:
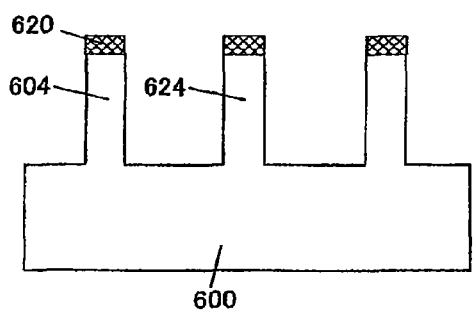
Figure 55:
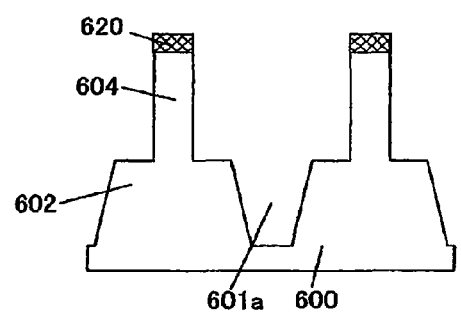
Figure 56:
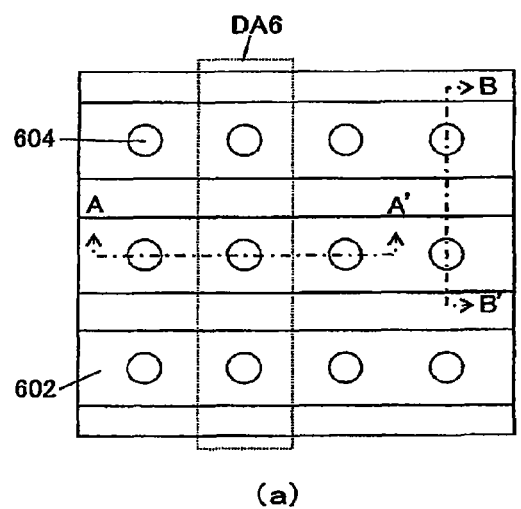
FIGS. 56(a) to 56(c) are process diagrams showing the production method for the SGT-DRAM according to the sixth embodiment, on a step-by-step basis.
Figure 56:
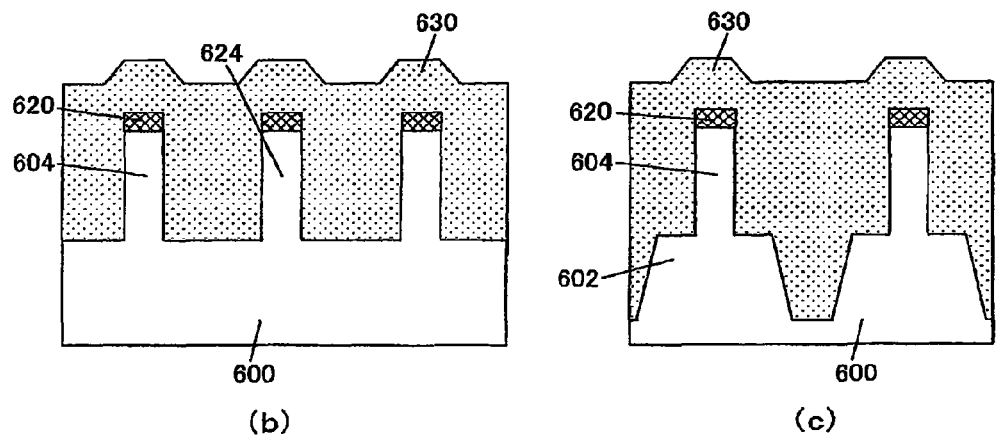
Figure 57:
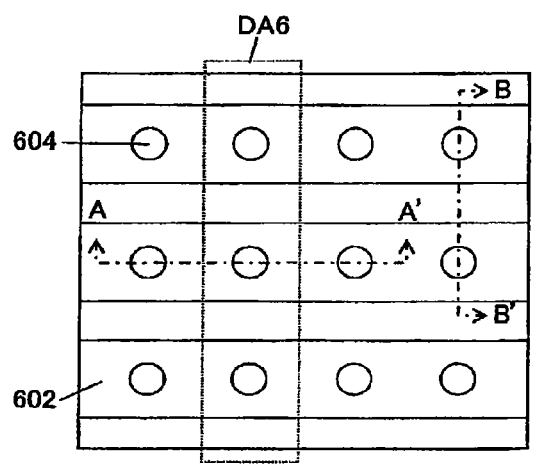
FIGS. 57(a) to 57(c) are process diagrams showing the production method for the SGT-DRAM according to the sixth embodiment, on a step-by-step basis.
Figure 57:
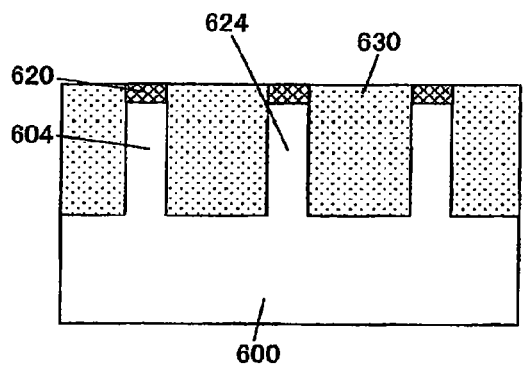
Figure 57:
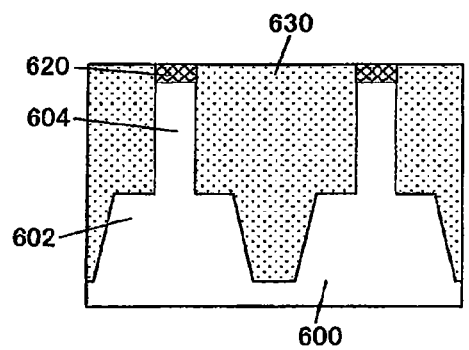
Figure 58:
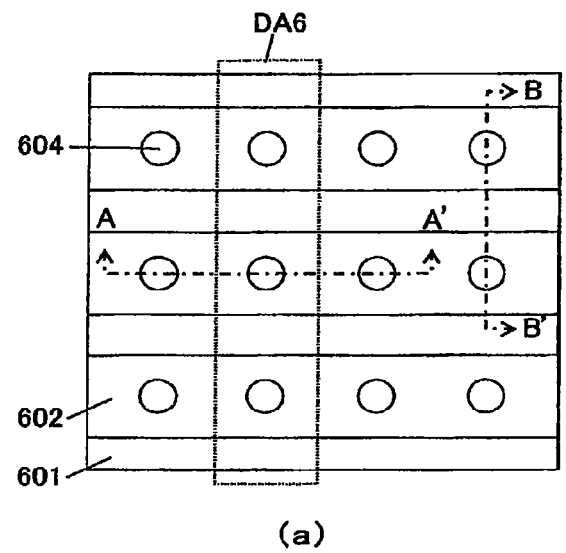
FIGS. 58(a) to 58(c) are process diagrams showing the production method for the SGT-DRAM according to the sixth embodiment, on a step-by-step basis.
Figure 58:
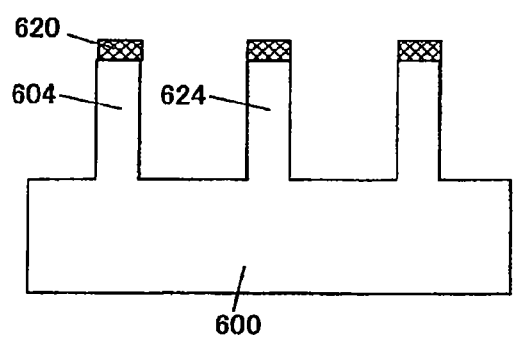
Figure 58:
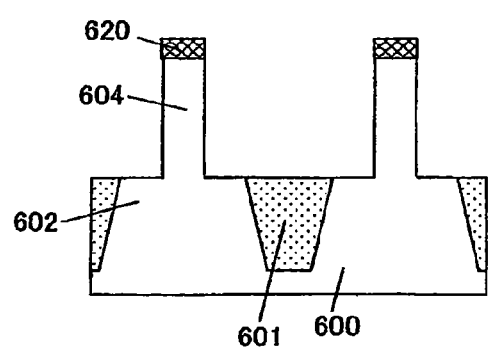
Figure 59:
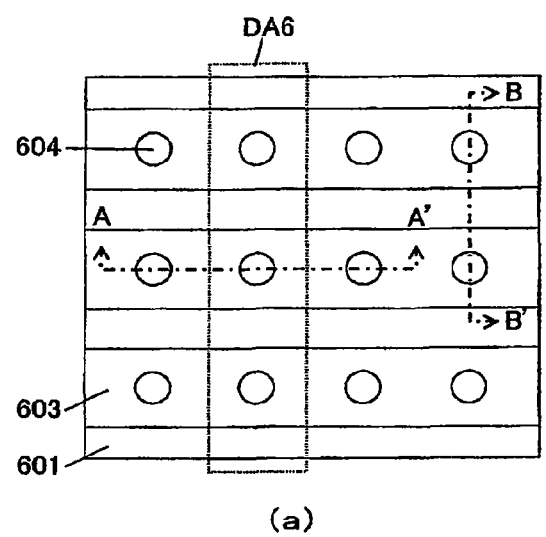
FIGS. 59(a) to 59(c) are process diagrams showing the production method for the SGT-DRAM according to the sixth embodiment, on a step-by-step basis.
Figure 59:
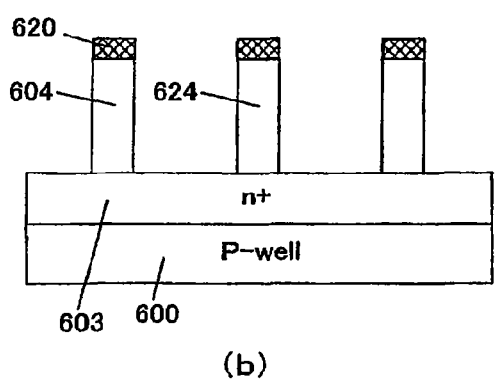
Figure 59:
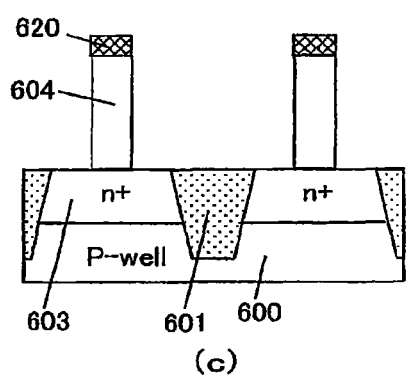
Figure 60:
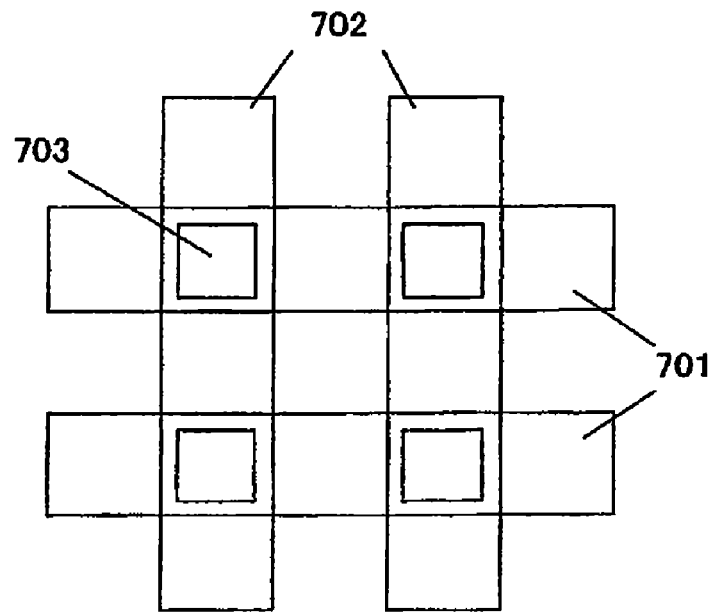
FIGS. 60(a) and 60(b) illustrate a conventional SGT-DRAM.
Figure 60:
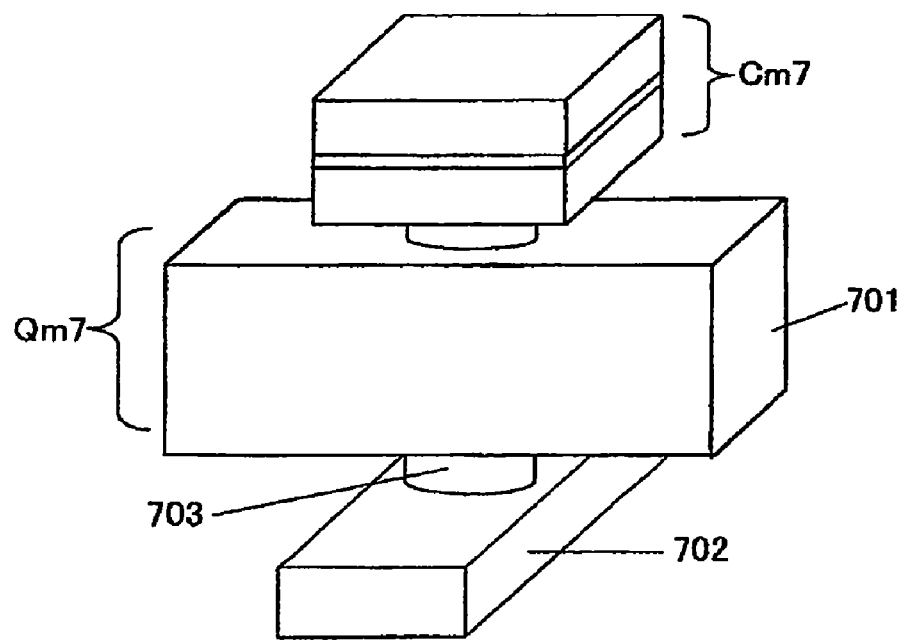
Figure 61:
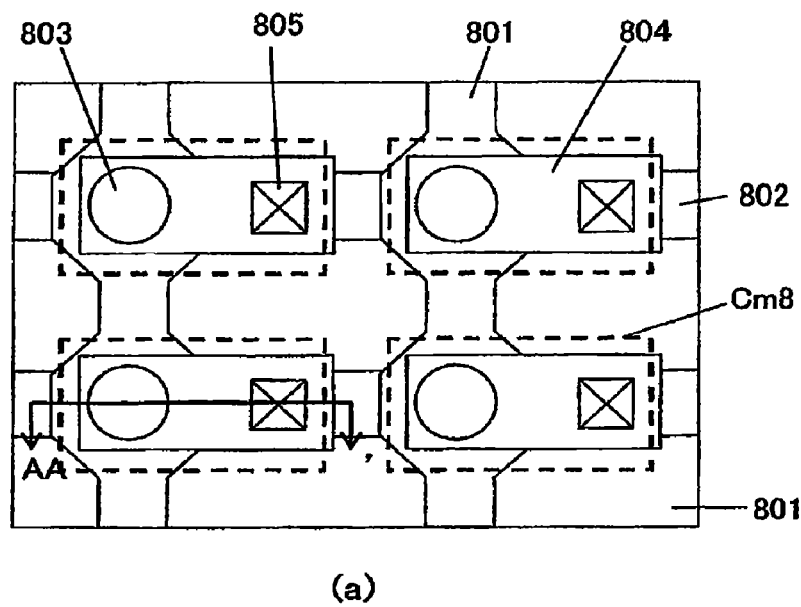
FIGS. 61(a) and 61(b) illustrate a conventional SGT-DRAM.
Figure 61:
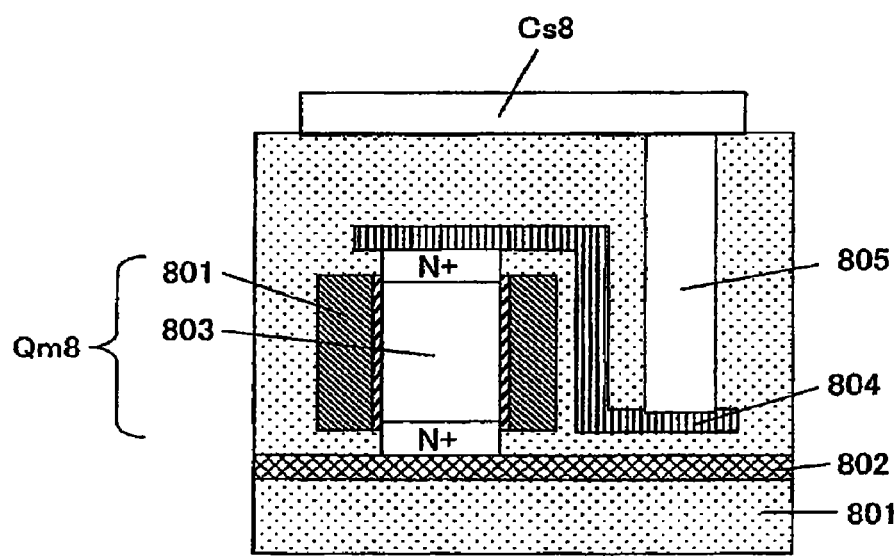

FIG. 50 is a top plan view showing a memory cell array in the sixth embodiment, wherein a regular memory cell section and a backing cell section DA6 are illustrated. FIG. 51 is a sectional view of the regular memory cell section and the backing cell section, taken along the line A-A' in FIG. 50. FIG. 52 is a sectional view of the regular memory cell section, taken along the line B-B' in FIG. 50, and FIG. 53 is a sectional view of the backing cell section, taken along the line C-C' in FIG. 50.

With reference to FIGS. 50 and 51, a top plan structure of the memory cell array will be described below. A high-resistance bit line BLa6 comprised of a lower diffusion layer 603 is wired on a silicon substrate 600 in a row direction.

In the regular memory cell section, a selection transistor Qm6 is formed on the lower diffusion layer 603 to allow access to a corresponding one of a plurality of regular memory cells. A gate dielectric film 607 and a gate electrode 608 are formed around a pillar-shaped silicon layer 604 constituting the selection transistor Qm6, and a regular word line WL6 comprised of a gate line 608a extending from the gate electrode of the selection transistor Qm6 is wired in a column direction. A capacitance contact 609 is formed on a top of the pillar-shaped silicon layer 604 of the selection transistor Qm6, and connected to a capacitance element Cm6.

In the backing cell section DA6, a backing transistor Qd6 is formed on the lower diffusion layer 603. A gate dielectric film 607 and a gate electrode 608 are formed around a pillar-shaped silicon layer 624 constituting the backing transistor Qd6, and a backing word line DWL6 comprised of a gate line 628a extending from the gate electrode of the backing transistor Qd6 is wired in the column direction. A bit-line contact 629 is formed on a top of the pillar-shaped silicon layer 624 of the backing transistor Qd6, and connected to a low-resistance bit line 613 (BLb6) comprised of a metal film. The low-resistance bit line BLb6 is wired in the row direction while avoiding contact with the capacitance contact 609 formed in the regular memory cell. As above, the high-resistance bit line BLa6 comprised of the N⁺ diffusion layer 602 is backed with the low-resistance bit line BLb6 through the backing transistor Qd6.

In the backing cell section, a structure and a layout configuration for a transistor and a capacitance element are set to be exactly the same as those in the regular memory cell section, so that formation of the backing cell section causes no change in characteristics of the selection transistor or the capacitance element in a part of the regular memory cells adjacent to the backing cell section. Thus, each of the high-resistance bit lines can be backed with a corresponding one of the low-resistance bit lines through the backing cell section to provide a substantially low-resistance bit line, while minimizing an increase in chip area, i.e., limiting an additional area to only an area of the backing cell section.

With reference to FIGS. 51 to 53, a cross-section structure of the memory cell array will be described below.

A lower diffusion layer (first layer) 603 serving as a high-resistance bit line BLa6 is formed on a silicon substrate 600. In a regular memory cell section illustrated in FIGS. 51 and 52, a selection transistor Qm6 is formed on the lower diffusion layer 603 to allow access to a corresponding one of the regular memory cells. A gate dielectric film 607 and a gate electrode 608 are formed around a pillar-shaped silicon layer 604 constituting the selection transistor Qm6, and a gate line 608a is formed to extend from the gate electrode to serve as a regular word line WL6. An upper diffusion layer 605 is formed in an upper portion of the pillar-shaped silicon layer 604 of the selection transistor Qm6, and a capacitance contact 609 is formed on the upper diffusion layer 605 and connected to a capacitance element Cm6. The capacitance element Cm6 comprises a lower electrode 610, a capacitance dielectric film 611, and an upper electrode 612.

In a backing cell section DA6 illustrated in FIGS. 51 and 53, a backing transistor Qd6 is formed on the lower diffusion layer 603. A gate dielectric film 607 and a gate electrode 608 are formed around a pillar-shaped silicon layer 624 constituting the backing transistor Qd6, and a gate line 628a is formed to extend from the gate electrode to serve as a backing word line DWL6. An upper diffusion layer 605 is formed in an upper portion of the pillar-shaped silicon layer 624 of the backing transistor Qd6, and a bit-line contact 629 is formed on the upper diffusion layer 605. The bit-line contact 629 is connected to a low-resistance bit line 613 (BLb6) comprised of a metal film (second layer). A dummy capacitance element Cd6 is formed just above the low-resistance bit line to maintain layout regularity of the capacitance elements.

With reference to FIGS. 54(a) to 59(c), one example of a production method for the SGT-DRAM according to the sixth embodiment will be described below. In FIGS. 54(a) to 59(c), the figure suffixed with (a) is a top plan view of a memory cell array. Further, the figure suffixed with (b) is a sectional view of a regular memory cell section and a backing cell section in the memory cell array, taken along the line A-A' in the figure suffixed with (a), and the figure suffixed with (c) is a sectional view of the regular memory cell section in the memory cell array, taken along the line B-B' in the figure suffixed with (a).

As shown in FIGS. 54(a) to 54(c), a mask layer 620 of a silicon nitride film is formed on a bulk silicon layer 600, and a selection-transistor pillar-shaped silicon layer (pillar-shaped silicon layer for a selection transistor) 604 and a backing-transistor pillar-shaped silicon layer (pillar-shaped silicon layer for a backing transistor) 624 are formed by lithographic patterning and etching. The selection-transistor pillar-shaped silicon layer 604 and the backing-transistor pillar-shaped silicon layer 624 are formed in exactly the same structure and layout configuration.

As shown in FIGS. 55(a) to 55(c), a line-shaped trench 601a is formed in a surface of the silicon substrate by etching to form a plurality of line-shaped silicon layers 602.

As shown in FIGS. 56(a) to 56(c), a silicon oxide film 630 is formed to allow the pillar-shaped silicon layer to be buried therein.

As shown in FIGS. 57(a) to 57(c), the silicon oxide film is flattened by CMP. During the CMP, the silicon nitride film-based mask 620 on a top of the pillar-shaped silicon layer can be used as a CMP stopper.

As shown in FIGS. 58(a) to 58(c), the silicon oxide film is etched back until a top surface of the silicon oxide film becomes flush with a top surface of the silicon substrate to form an element isolation region 601.

As shown in FIGS. 59(a) to 59(c), an impurity is implanted into the surface of the silicon substrate to form an N⁺ lower diffusion layer 603 serving as a high-resistance bit line BLa6. In this step, the silicon nitride film-based mask 620 prevents the impurity from being introduced into an upper portion of the pillar-shaped silicon layer.

The subsequent steps are the same as those in the first embodiment, and their description will be omitted.

As above, in the SGT-DRAM using a bulk silicon substrate, a high-resistance bit line can be backed with a low-resistance bit line in the same manner as that in the SGT-DRAM using an SOI substrate.

As described above, in a first aspect of the present invention, there is provided an SGT-based semiconductor storage, in which a first bit line comprised of a diffusion layer formed on a buried oxide film is backed with a second bit line having a lower resistance than that of the first bit layer, through a bit line-backing transistor having the same structure as that of a selection transistor in a memory cell. This makes it possible to provide a substantially low-resistance bit line, while minimizing an increase in chip area.

In a second aspect of the present invention, there is provided an SGT-based semiconductor storage in which the first bit line is backed with the second bit line, through a pillar-shaped silicon layer after removing a gate electrode formed therearound. This makes it possible to form a bit-line backing configuration through a lower resistance.

In a third aspect of the present invention, there is provided an SGT-based semiconductor storage in which the first bit line is backed with the second bit line, through a contact. This makes it possible to form a bit-line backing configuration through a lower resistance and in a simple manner.

We claim:

1. A semiconductor storage device comprising:
   a memory cell array formed using a vertical transistor which has a structure where a drain, a gate, and a source are arranged in a vertical direction with respect to a pillar-shaped semiconductor layer and a gate electrode surrounds the pillar-shaped semiconductor layer;
   first bit lines formed by a first layer, said first bit lines being wired in a row direction so that each first bit line is connected to a sense amplifier;
   second bit lines formed by a second layer, said second bit lines being wired in the row direction so that each second bit line is connected to a sense amplifier; and
   a plurality of vertical transistors and a plurality of contacts formed on each first bit line,
   wherein each vertical transistor is a first transistor for selecting a memory cell, and a gate electrode of the first transistor is connected to a corresponding one of word lines wired in a column direction, wherein each first bit line and a corresponding second bit line are connected to one another through a corresponding contact formed on each first bit line.

2. The semiconductor storage device according to claim 1, wherein each second bit line has a lower resistance with respect to each first bit line.

3. The semiconductor storage device according to claim 1, wherein the memory cell array is configured to have a structure where a word line and a bit line intersect each other, and a memory cell is formed at the intersection of the word line and the bit line.

4. The semiconductor storage device according to claim 1, wherein the memory cell is a dynamic memory formed by a single transistor consisting of the first transistor and a single capacitance element.

5. The semiconductor storage device according to claim 1, further comprising a first contact formed above the first transistor and connected to a capacitance element formed above the first contact, and a second contact formed above a contact formed on each first bit line and connected to a corresponding one of the second bit lines formed in a lower-level layer than that of a capacitance element formed above the second contact,
wherein the first contact is formed between the second bit lines so that the first contact is electrically isolated from the second bit lines.

6. The semiconductor storage device according to claim 1, further comprising a first contact formed above the first transistor and connected to a capacitance element formed above the first contact, and a second contact formed above a contact formed on each first bit line,
wherein the second contact is led out above a capacitance element through a contact hole formed in an electrode the capacitance element formed above the second contact to be connected to a corresponding one of the second bit lines formed by the second layer formed in a higher-level layer than that of the capacitance element.

* * * * *

UNITED STATES PATENT AND TRADEMARK OFFICE
CERTIFICATE OF CORRECTION

PATENT NO.      : 8,218,387 B2
APPLICATION NO. : 13/208826
DATED           : July 10, 2012
INVENTOR(S)     : Fujio Masuoka et al.

It is certified that error appears in the above-identified patent and that said Letters Patent is hereby corrected as shown below:

On the Title Page

Right column, line 2, under "OTHER PUBLICATIONS", after "dated May 13, 2008, 1 page." start a new paragraph with the words "International Search".

Signed and Sealed this
Twenty-seventh Day of November, 2012

David J. Kappos
*Director of the United States Patent and Trademark Office*